(12) United States Patent
Hopkins

(10) Patent No.: US 10,340,393 B2
(45) Date of Patent: *Jul. 2, 2019

(54) SEMICONDUCTOR CONSTRUCTIONS, METHODS OF FORMING VERTICAL MEMORY STRINGS, AND METHODS OF FORMING VERTICALLY-STACKED STRUCTURES

(71) Applicant: Micron Technology, Inc., Boise, ID (US)

(72) Inventor: John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/100,003

(22) Filed: Aug. 9, 2018

(65) Prior Publication Data

US 2019/0006520 A1  Jan. 3, 2019

Related U.S. Application Data

(60) Continuation of application No. 15/467,765, filed on Mar. 23, 2017, now Pat. No. 10,121,906, which is a
(Continued)

(51) Int. Cl.
*H01L 29/788* (2006.01)
*H01L 29/66* (2006.01)
(Continued)

(52) U.S. Cl.
CPC ...... *H01L 29/7889* (2013.01); *H01L 21/0217* (2013.01); *H01L 21/02164* (2013.01);
(Continued)

(58) Field of Classification Search
CPC ......... H01L 27/11556; H01L 27/11578; H01L 27/11551; H01L 27/11565;
(Continued)

(56) References Cited

U.S. PATENT DOCUMENTS 6,057,193 A   5/2000  Wang et al.
6,063,666 A   5/2000  Chang et al.
(Continued)

FOREIGN PATENT DOCUMENTS

CN    102456675       5/2012
JP    2012-204437     10/2012
(Continued)

OTHER PUBLICATIONS

Wang et al., "Electrical Properties of Crystalline YSZ Films on Silicon as Alternative Gate Dielectrics", Semiconductor Science & Technology 16, 2001, United Kingdom, pp. L13-L16.

*Primary Examiner* — Mohammed Shamsuzzaman
*Assistant Examiner* — Aaron J Gray
(74) *Attorney, Agent, or Firm* — Wells St. John P.S.

(57) ABSTRACT

Some embodiments include methods of forming vertical memory strings. A trench is formed to extend through a stack of alternating electrically conductive levels and electrically insulative levels. An electrically insulative panel is formed within the trench. Some sections of the panel are removed to form openings. Each opening has a first pair of opposing sides along the stack, and has a second pair of opposing sides along remaining sections of the panel. Cavities are formed to extend into the electrically conductive levels along the first pair of opposing sides of the openings. Charge blocking material and charge-storage material is formed within the cavities. Channel material is formed within the openings and is spaced from the charge-storage material by gate dielectric material. Some embodiments include semiconductor constructions, and some embodiments include methods of forming vertically-stacked structures.

12 Claims, 36 Drawing Sheets

Related U.S. Application Data continuation of application No. 14/802,930, filed on Jul. 17, 2015, now Pat. No. 9,627,550, which is a division of application No. 13/735,908, filed on Jan. 7, 2013, now Pat. No. 9,105,737.

(51) Int. Cl.

| | | |
|---|---|---|
| *H01L 29/792* | (2006.01) | |
| *H01L 21/336* | (2006.01) | |
| *H01L 21/28* | (2006.01) | |
| *H01L 21/02* | (2006.01) | |
| *H01L 27/11556* | (2017.01) | |
| *H01L 27/11582* | (2017.01) | |
| *H01L 29/423* | (2006.01) | |
| *H01L 29/51* | (2006.01) | |

(52) U.S. Cl.
CPC .. *H01L 21/28273* (2013.01); *H01L 21/28282* (2013.01); *H01L 27/11556* (2013.01); *H01L 27/11582* (2013.01); *H01L 29/42328* (2013.01); *H01L 29/42344* (2013.01); *H01L 29/511* (2013.01); *H01L 29/66825* (2013.01); *H01L 29/66833* (2013.01); *H01L 29/7926* (2013.01); *H05K 999/99* (2013.01)

(58) Field of Classification Search
CPC ........... H01L 27/11582; H01L 29/7926; H01L 29/66833; H01L 29/792; H01L 29/115; H01L 29/7889
USPC ................ 257/324, 319, 315, 326, E29.309, 257/E21.423, E21.679, E27.103, E21.21; 438/268, 257, 261
See application file for complete search history.

(56) References Cited

U.S. PATENT DOCUMENTS

| | | | |
|---|---|---|---|
| 6,143,604 A | 11/2000 | Chiang et al. | |
| 6,180,454 B1 | 1/2001 | Chang et al. | |
| 6,274,471 B1 | 8/2001 | Huang | |
| 6,353,242 B1 | 3/2002 | Watanabe et al. | |
| 6,661,691 B2 | 12/2003 | Fricke et al. | |
| 6,803,318 B1 | 10/2004 | Qiao et al. | |
| 7,112,488 B2 | 9/2006 | Helm et al. | |
| 7,112,490 B1 | 9/2006 | Hong et al. | |
| 7,196,004 B2 | 3/2007 | Lee et al. | |
| 7,419,895 B2 | 9/2008 | Lindsay | |
| 7,713,819 B2 | 5/2010 | Okajima | |
| 7,790,360 B2 | 9/2010 | Alapati et al. | |
| 7,829,935 B2 | 11/2010 | Makihara et al. | |
| 7,898,856 B2 | 3/2011 | Aritome | |
| 7,906,818 B2 | 3/2011 | Pekny | |
| 7,968,406 B2 | 6/2011 | Ramaswamy et al. | |
| 8,148,216 B2 | 4/2012 | Arai et al. | |
| 8,154,068 B2 | 4/2012 | Katsumata et al. | |
| 8,183,110 B2 | 5/2012 | Ramaswamy et al. | |
| 8,187,938 B2 | 5/2012 | Lim et al. | |
| 8,207,570 B2 | 6/2012 | Alapati et al. | |
| 8,228,743 B2 | 7/2012 | Min et al. | |
| 8,237,213 B2 | 8/2012 | Liu | |
| 8,278,695 B2 | 10/2012 | Kidoh et al. | |
| 8,283,205 B2 | 10/2012 | Pagalia et al. | |
| 8,288,811 B2 | 10/2012 | Ramaswamy et al. | |
| 8,431,456 B2 | 4/2013 | Alapati et al. | |
| 8,437,192 B2 | 5/2013 | Lung et al. | |
| 8,450,791 B2 | 5/2013 | Alsmeier | |
| 8,507,976 B2 | 8/2013 | Joo | |
| 8,614,126 B1 * | 12/2013 | Lee ...................... H01L 21/764 257/E29.309 | |
| 8,928,061 B2 | 1/2015 | Chien | |
| 8,969,153 B2 | 3/2015 | Lee et al. | |
| 8,994,094 B2 | 3/2015 | Matsuda | |
| 9,041,090 B2 | 5/2015 | Simsek-Ege et al. | |
| 9,105,737 B2 | 8/2015 | Hopkins | |
| 2003/0201500 A1 | 10/2003 | Furukawa et al. | |
| 2004/0256657 A1 | 12/2004 | Hung | |
| 2005/0012135 A1 | 1/2005 | Hsieh | |
| 2005/0200026 A1 | 9/2005 | Liaw | |
| 2006/0007735 A1 | 1/2006 | Yeh | |
| 2007/0004140 A1 | 1/2007 | Jang et al. | |
| 2007/0004141 A1 | 1/2007 | Kim et al. | |
| 2007/0048989 A1 | 3/2007 | Ahn et al. | |
| 2008/0009113 A1 | 1/2008 | Shimizu | |
| 2008/0179659 A1 | 7/2008 | Enda et al. | |
| 2008/0220600 A1 | 9/2008 | Alapati et al. | |
| 2008/0253183 A1 | 10/2008 | Mizukami | |
| 2008/0303067 A1 | 12/2008 | Rao | |
| 2009/0117725 A1 | 5/2009 | Sun | |
| 2009/0230454 A1 * | 9/2009 | Pekny ............... H01L 27/11568 257/319 | |
| 2009/0289297 A1 | 11/2009 | Kim et al. | |
| 2009/0296476 A1 | 12/2009 | Shin et al. | |
| 2009/0310425 A1 | 12/2009 | Sim et al. | |
| 2010/0013049 A1 | 1/2010 | Tanaka et al. | |
| 2010/0019310 A1 | 1/2010 | Sakamoto | |
| 2010/0044776 A1 | 2/2010 | Ishiduki et al. | |
| 2010/0059811 A1 | 3/2010 | Sekine et al. | |
| 2010/0155813 A1 | 6/2010 | Murata et al. | |
| 2010/0171162 A1 | 7/2010 | Katsumata et al. | |
| 2010/0208503 A1 | 8/2010 | Kuo | |
| 2010/0237402 A1 | 9/2010 | Sekine et al. | |
| 2010/0258852 A1 | 10/2010 | Lim et al. | |
| 2010/0276743 A1 | 11/2010 | Kuniya et al. | |
| 2010/0295114 A1 | 11/2010 | Alapati et al. | |
| 2011/0019486 A1 | 1/2011 | Jang et al. | |
| 2011/0024816 A1 | 2/2011 | Moon et al. | |
| 2011/0031550 A1 | 2/2011 | Komori et al. | |
| 2011/0032772 A1 | 2/2011 | Aritome | |
| 2011/0059595 A1 | 3/2011 | Jung | |
| 2011/0090737 A1 | 4/2011 | Yoo et al. | |
| 2011/0140068 A1 * | 6/2011 | Ozawa .................. H01L 27/249 257/4 | |
| 2011/0147823 A1 * | 6/2011 | Kuk .................. H01L 27/11551 257/324 | |
| 2011/0149656 A1 | 6/2011 | Tang et al. | |
| 2011/0177661 A1 | 7/2011 | Song et al. | |
| 2011/0180865 A1 | 7/2011 | Ramaswamy | |
| 2011/0193153 A1 * | 8/2011 | Higuchi ............ H01L 27/11578 257/324 | |
| 2011/0241098 A1 | 10/2011 | Park et al. | |
| 2011/0291172 A1 | 12/2011 | Hwang et al. | |
| 2011/0316063 A1 * | 12/2011 | Tang ................... H01L 27/0688 257/314 | |
| 2011/0316064 A1 | 12/2011 | Kim et al. | |
| 2012/0001249 A1 | 1/2012 | Alsmeier et al. | |
| 2012/0012921 A1 | 1/2012 | Liu | |
| 2012/0018796 A1 * | 1/2012 | Yahashi ............ H01L 27/11573 257/324 | |
| 2012/0068247 A1 | 3/2012 | Lee et al. | |
| 2012/0086072 A1 | 4/2012 | Yun et al. | |
| 2012/0098050 A1 | 4/2012 | Shim et al. | |
| 2012/0119285 A1 | 5/2012 | Yang | |
| 2012/0135583 A1 | 5/2012 | Jang et al. | |
| 2012/0175697 A1 | 7/2012 | Hall et al. | |
| 2012/0184078 A1 | 7/2012 | Kiyotoshi | |
| 2012/0193596 A1 | 8/2012 | Nakazawa | |
| 2012/0205722 A1 | 8/2012 | Lee et al. | |
| 2012/0211822 A1 | 8/2012 | Lim et al. | |
| 2012/0211823 A1 | 8/2012 | Lim et al. | |
| 2012/0217564 A1 | 8/2012 | Tang et al. | |
| 2012/0220088 A1 | 8/2012 | Alsmeier | |
| 2012/0231593 A1 | 9/2012 | Joo et al. | |
| 2012/0238077 A1 | 9/2012 | Alapati et al. | |
| 2012/0241831 A1 | 9/2012 | Lindholm | |
| 2012/0241842 A1 | 9/2012 | Matsuda | |
| 2012/0329224 A1 | 12/2012 | Kong et al. | |
| 2013/0087843 A1 | 4/2013 | Han | |
| 2013/0109157 A1 | 5/2013 | Kito | |
| 2013/0193503 A1 | 8/2013 | Lee et al. | |
| 2014/0008714 A1 | 1/2014 | Makala et al. | |
| 2014/0061750 A1 | 3/2014 | Kwon | |

(56) References Cited

U.S. PATENT DOCUMENTS

| | | |
|---|---|---|
| 2014/0131784 A1 | 5/2014 | Davis |
| 2014/0162418 A1 | 6/2014 | Keshav et al. |
| 2014/0191306 A1 | 7/2014 | Hopkins |
| 2014/0191340 A1 | 7/2014 | Thimmegowa et al. |
| 2014/0203344 A1 | 7/2014 | Hopkins et al. |
| 2014/0217488 A1 | 8/2014 | Thimmegowa et al. |
| 2014/0252447 A1 | 9/2014 | Lee |
| 2014/0339621 A1 | 11/2014 | Ramaswamy |
| 2014/0339624 A1 | 11/2014 | Ramaswamy |

FOREIGN PATENT DOCUMENTS

| | | |
|---|---|---|
| KR | 10-2010-0081943 | 7/2010 |
| KR | 10-2011-0000487 | 1/2011 |
| KR | 10-2011-0120654 | 11/2011 |
| KR | 10-2012-0113596 | 10/2012 |
| TW | 200845125 | 11/2008 |
| TW | 102138545 | 4/2015 |
| WO | WO PCT/US2013/063302 | 1/2014 |
| WO | WO PCT/US2014/011228 | 4/2014 |
| WO | WO PCT/US2013/063302 | 5/2015 |
| WO | WO PCT/US2014/011228 | 8/2015 |

\* cited by examiner

SEMICONDUCTOR CONSTRUCTIONS, METHODS OF FORMING VERTICAL MEMORY STRINGS, AND METHODS OF FORMING VERTICALLY-STACKED STRUCTURES

RELATED PATENT DATA

This patent resulted from a continuation of U.S. patent application Ser. No. 15/467,765 which was filed Mar. 23, 2017, which is a continuation of U.S. patent application Ser. No. 14/802,930 which was filed Jul. 17, 2015, which is a divisional of U.S. patent application Ser. No. 13/735,908 which was filed on Jan. 7, 2013, now U.S. Pat. No. 9,105,737, each of which is each hereby incorporated by reference in its entirety.

TECHNICAL FIELD

Semiconductor constructions, methods of forming vertical memory strings, and methods of forming vertically-stacked structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. The flash memory may be erased and reprogrammed in blocks.

NAND may be a basic architecture of flash memory. A NAND string comprises at least one selecting device coupled in series to a serial combination of memory cells. Example NAND architecture is described in U.S. Pat. No. 7,898,850.

There is continuing goal to develop improved NAND architectures, and to develop methods of forming such NAND architectures.

DETAILED DESCRIPTION OF THE ILLUSTRATED EMBODIMENTS

In some embodiments, new processing is utilized to form vertically-stacked structures, such as, for example, vertically-stacked gates of vertical memory strings (e.g., NAND strings). Some example embodiments are described with reference to FIGS. 1-36.

Figure 1:
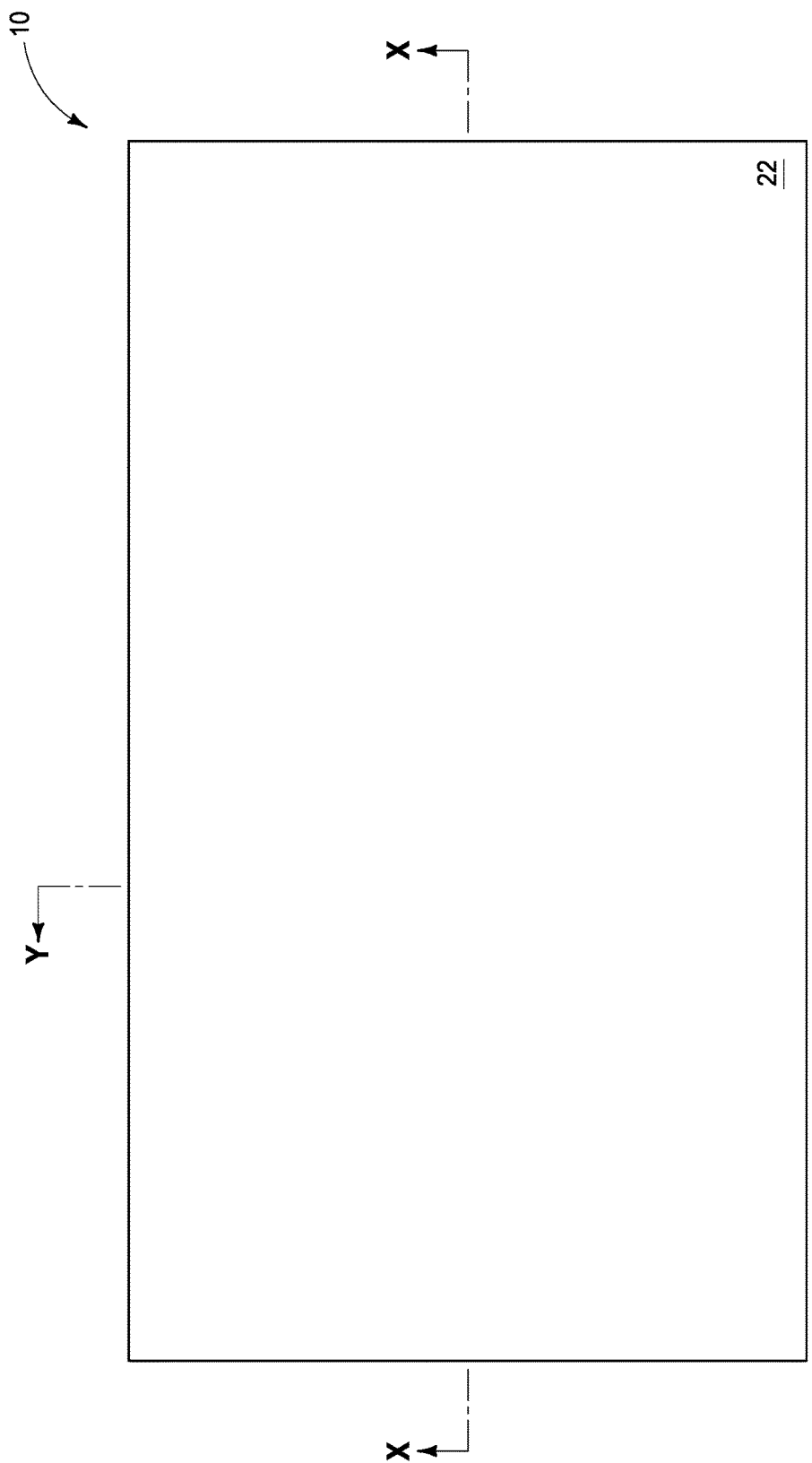
FIGS. 1, 4, 7, 10, 13, 16, 19, 22 and 25 are top views of a portion of a semiconductor construction at various process stages of an example embodiment method of forming vertical memory strings.
Figure 2:
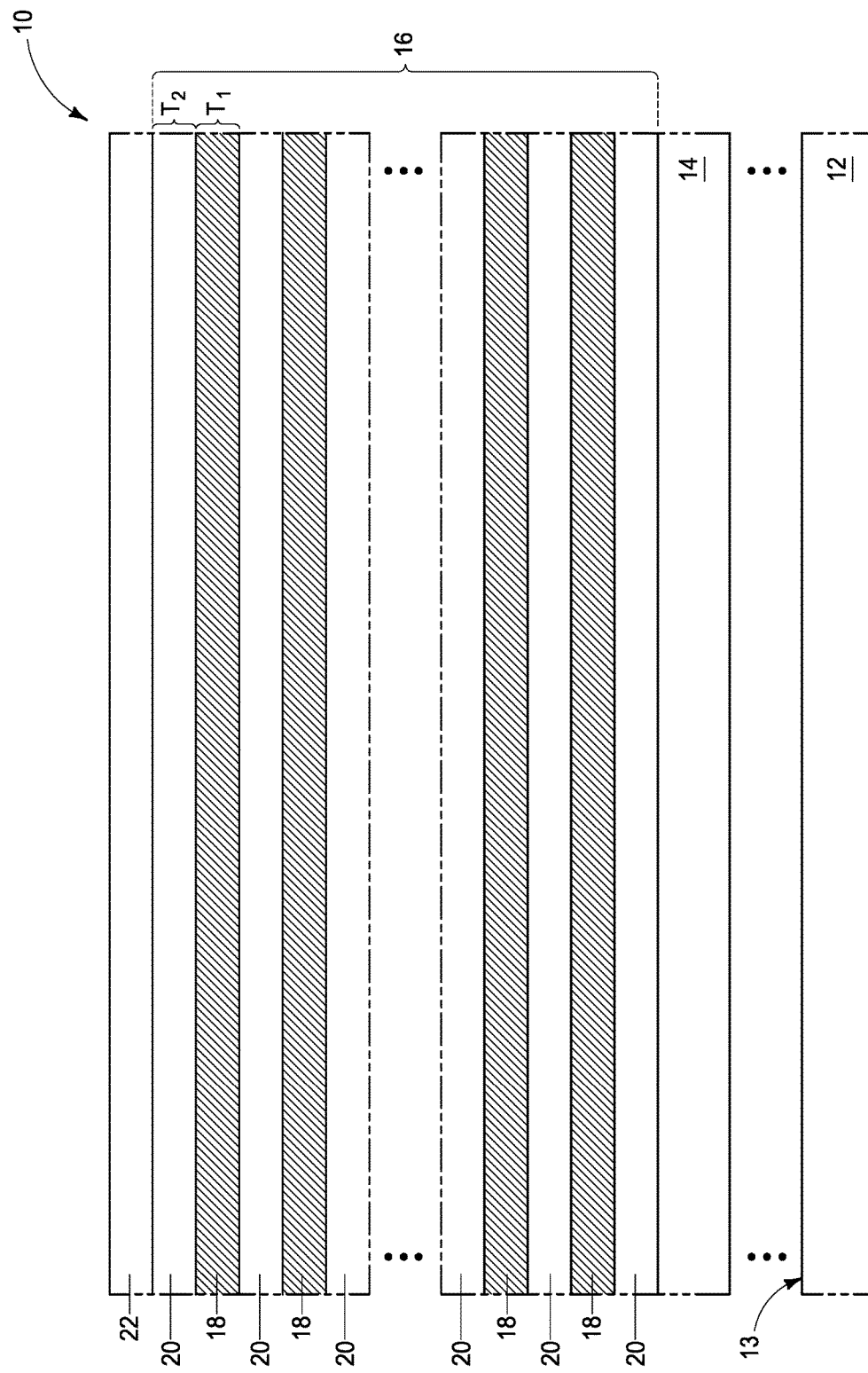
FIGS. 2, 5, 8, 11, 14, 17, 20, 23 and 26 are diagrammatic cross-sectional views along the lines X-X of FIGS. 1, 4, 7, 10, 13, 16, 19, 22 and 25, respectively.
Figure 3:
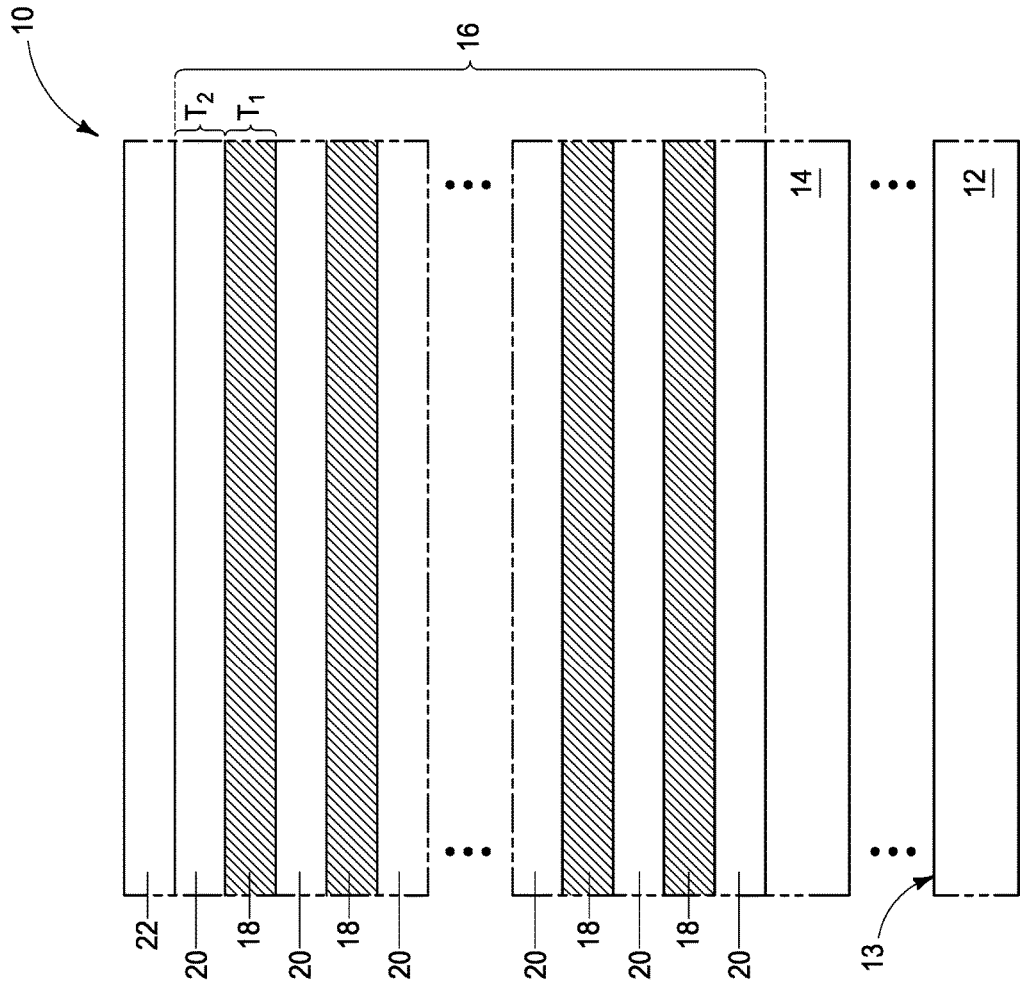
FIGS. 3, 6, 9, 12, 15, 18, 21, 24 and 27 are diagrammatic cross-sectional views along the lines Y-Y of FIGS. 1, 4, 7, 10, 13, 16, 19, 22 and 25, respectively.

Referring to FIGS. 1-3, a semiconductor construction 10 includes an etchstop material 14 supported by a base 12. A break is provided between the etchstop material 14 and the base 12 to indicate that there may be additional materials and/or integrated circuit structures between the base and the etchstop material in some embodiments.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Such materials may include, for example, one or more of refractory metal materials, barrier materials, diffusion materials, insulator materials, etc.

The etchstop material 14 may comprise any suitable composition or combination of compositions; and in some embodiments may comprise, consist essentially of, or consist of aluminum oxide or tungsten silicide.

A stack 16 of alternating electrically conductive levels 18 and electrically insulative levels 20 is formed over the etchstop material 14. The levels 18 and 20 may be of any suitable configuration; including, for example, sheets, layers, etc.

The electrically conductive levels 18 may comprise any suitable electrically conductive material; and in some embodiments may comprise, consist essentially of, or consist of one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, in some embodiments the electrically conductive levels 18 may comprise, consist essentially of, or consist of conductively-doped silicon; such as, for example, n-type doped polycrystalline silicon.

In some embodiments, the electrically conductive levels 18 comprise control gate material, and are ultimately patterned into control gates of flash devices. Such example processing may form vertical memory strings, with the number of memory cells in each string being determined by the number of electrically conductive levels 18. A break is provided within the stack 16 to indicate that there may be more levels in the stack than are shown. The stack may have any number of levels suitable to form a desired structure. For instance, in some embodiments the stack may have 8 electrically conductive levels, 16 electrically conductive levels, 32 electrically conductive levels, 36 electrically conductive levels, 64 electrically conductive levels, 72 electrically conductive levels, etc.

The electrically insulative levels 20 may comprise any suitable composition; and in some embodiments may comprise, consist essentially of, or consist of silicon dioxide.

The electrically conductive levels 18 may be of any suitable thickness ($T_1$), and in some embodiments may have a thickness within a range of from about 5 nm to about 300 nm; such as, for example, a thickness of about 30 nm. The electrically insulative levels 20 may be of any suitable thickness ($T_2$), and in some embodiments may have a thickness within a range of from about 5 nm to about 200 nm; such as, for example, a thickness of about 20 nm.

In the shown embodiment, the base 12 has a substantially horizontal primary surface 13. In some embodiments, subsequent processing (described below) may be utilized to form a memory string which extends along a vertical direction; or in other words, which extends along a direction which is substantially orthogonal to that of the horizontal primary surface 13.

A hardmask material 22 is formed over stack 16. The hardmask material 22 may comprise any suitable composition or combination of compositions; and in some embodiments may comprise, consist essentially of, or consist of silicon nitride.

Figure 4:
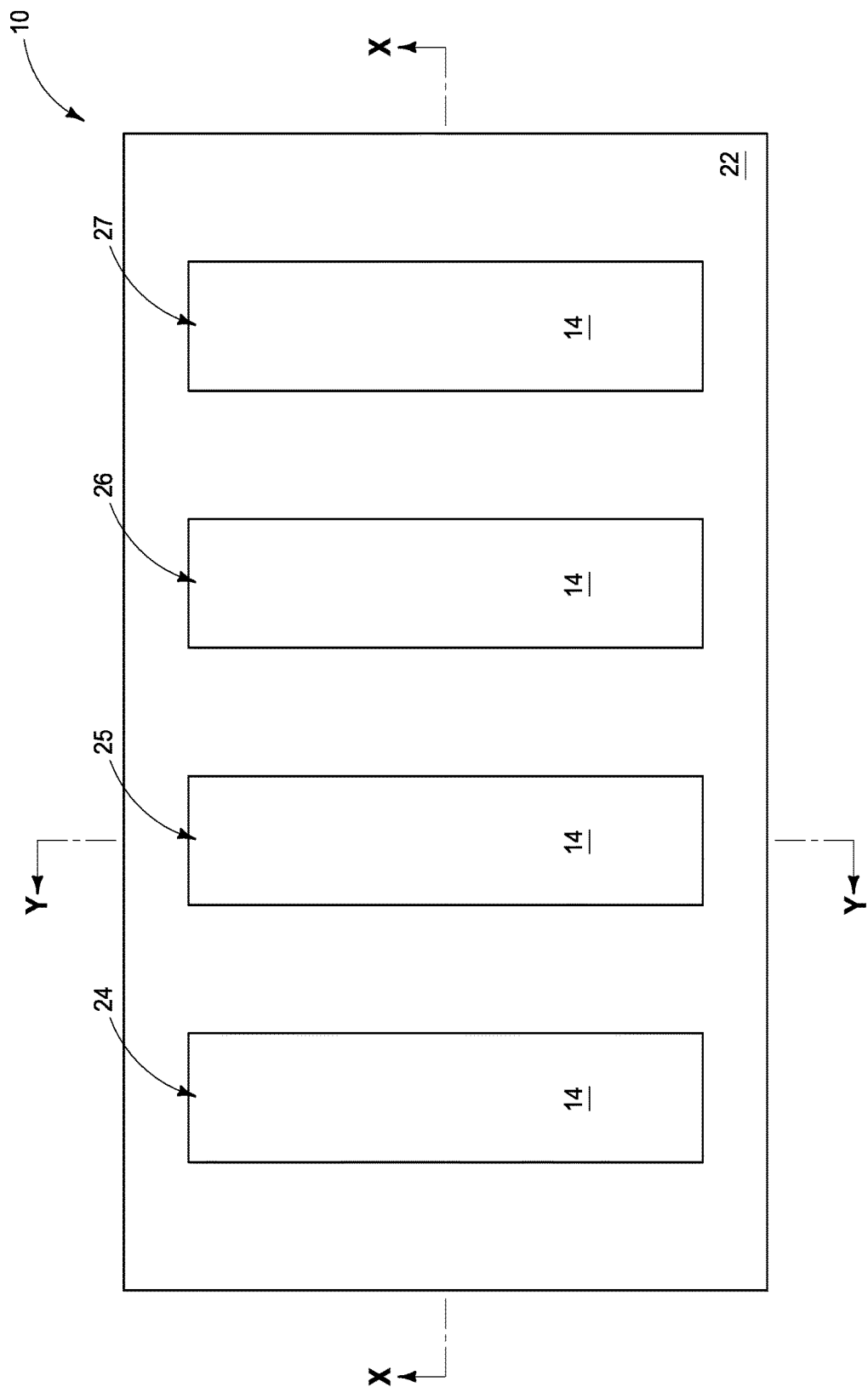
Figure 5:
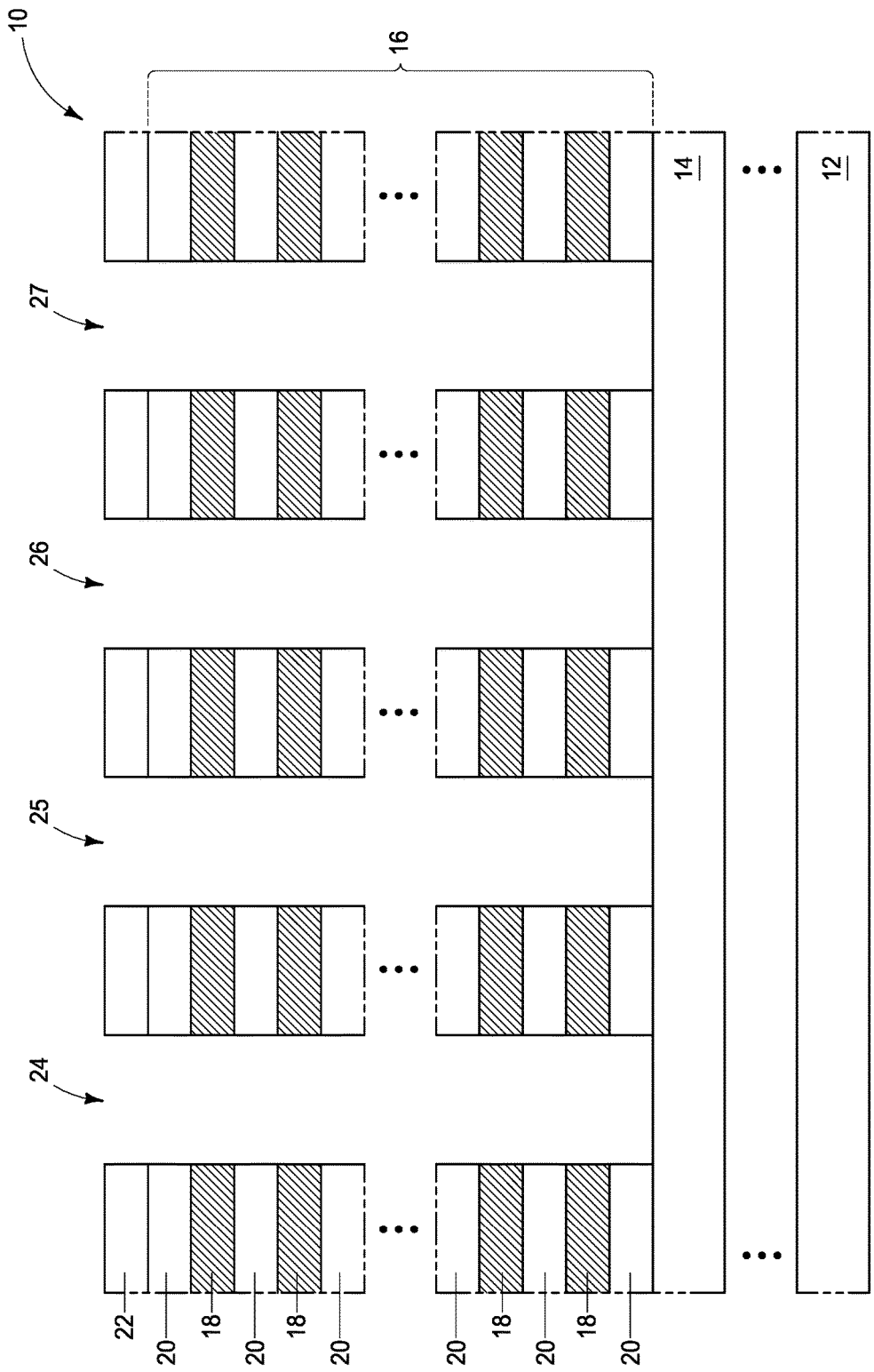
Figure 6:
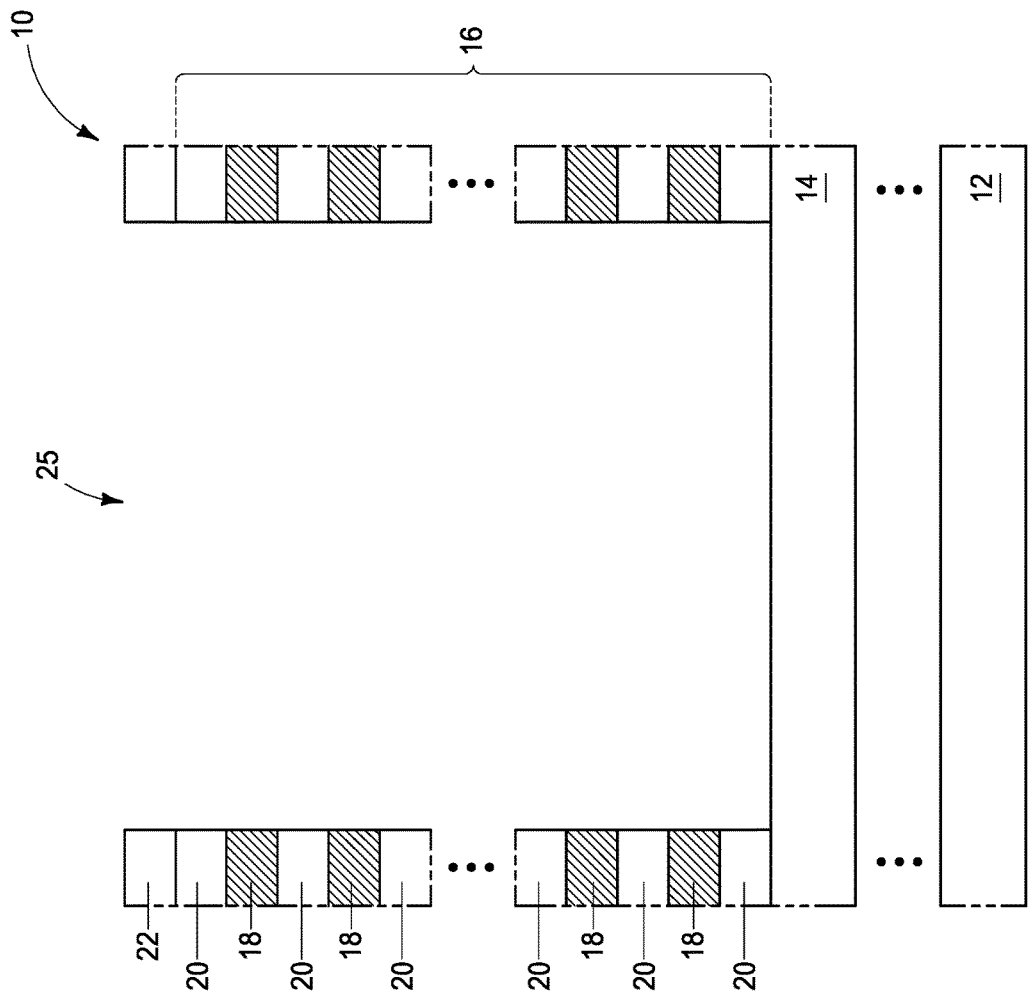

Referring to FIGS. 4-6, trenches 24-27 are formed to extend through the stack 16 to the etchstop material 14. The trenches may be formed with any suitable processing. For instance, in some embodiments a patterned masking material (not shown) may be formed over the hardmask material 22 to define locations of the trenches 24-27, a pattern from the masking material may be transferred into hardmask material 22 with one or more suitable etches, and then the pattern may be transferred from the hardmask material into stack 16 with one or more suitable etches. The patterned masking material may be removed at some point subsequent to the patterning of hardmask material 22. The masking material may comprise any suitable composition, and in some embodiments may comprise a photolithographically-patterned photoresist mask and/or a mask formed utilizing pitch-multiplication methodologies. In some embodiments, other materials (not shown) may be provided between a patterned masking material and the hardmask material 22. For instance, if the masking material comprises photolithographically-patterned photoresist, an antireflective material (not shown) and a carbon-containing material (not shown) may be provided between the hardmask material 22 and the photoresist. Such materials may be removed during or after formation of the trenches within stack 16 to leave the construction shown in FIGS. 4-6.

In the shown embodiment of FIGS. 4-6, trenches 24-27 are linear trenches which are substantially parallel to one another. The term "substantially parallel" means that the trenches are parallel to within reasonable tolerances of fabrication and measurement. Although the linear trenches of FIGS. 4-6 are shown to be separate from one another, in other embodiments (such as, for example, an embodiment described below with reference to FIGS. 33-36) a single serpentining trench may be formed which encompasses linear regions at the locations of trenches 24-27.

Figure 7:
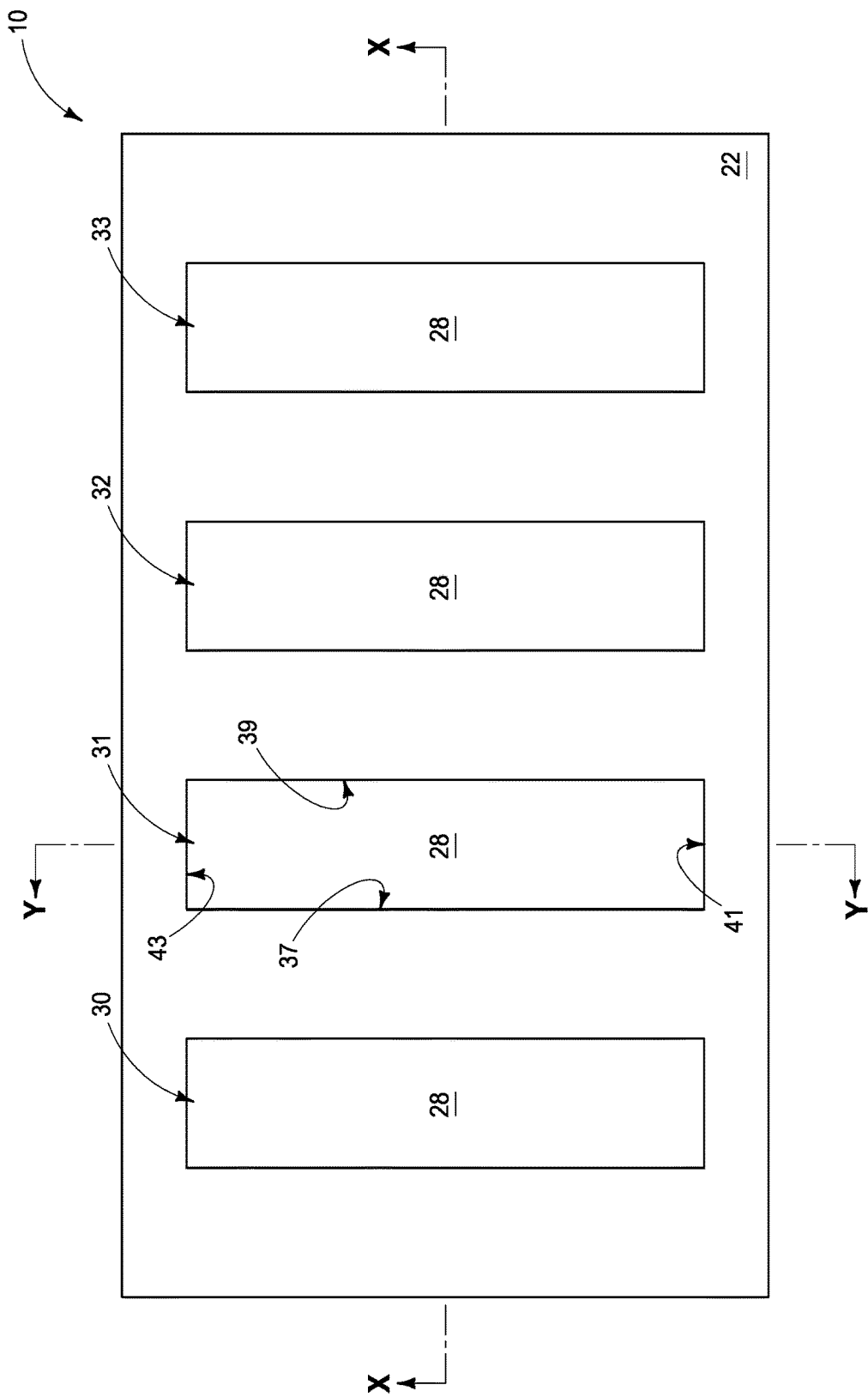
Figure 8:
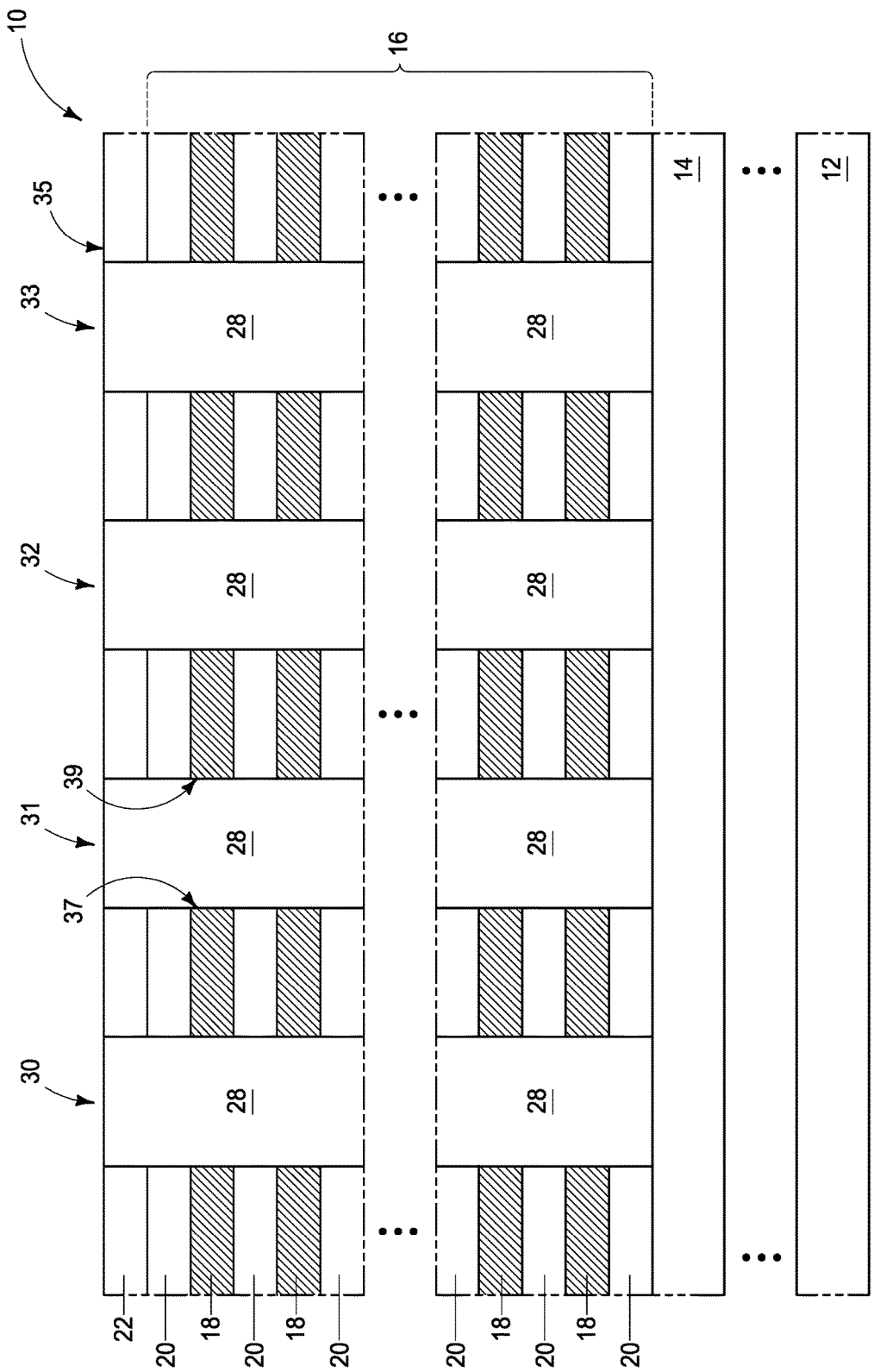
Figure 9:
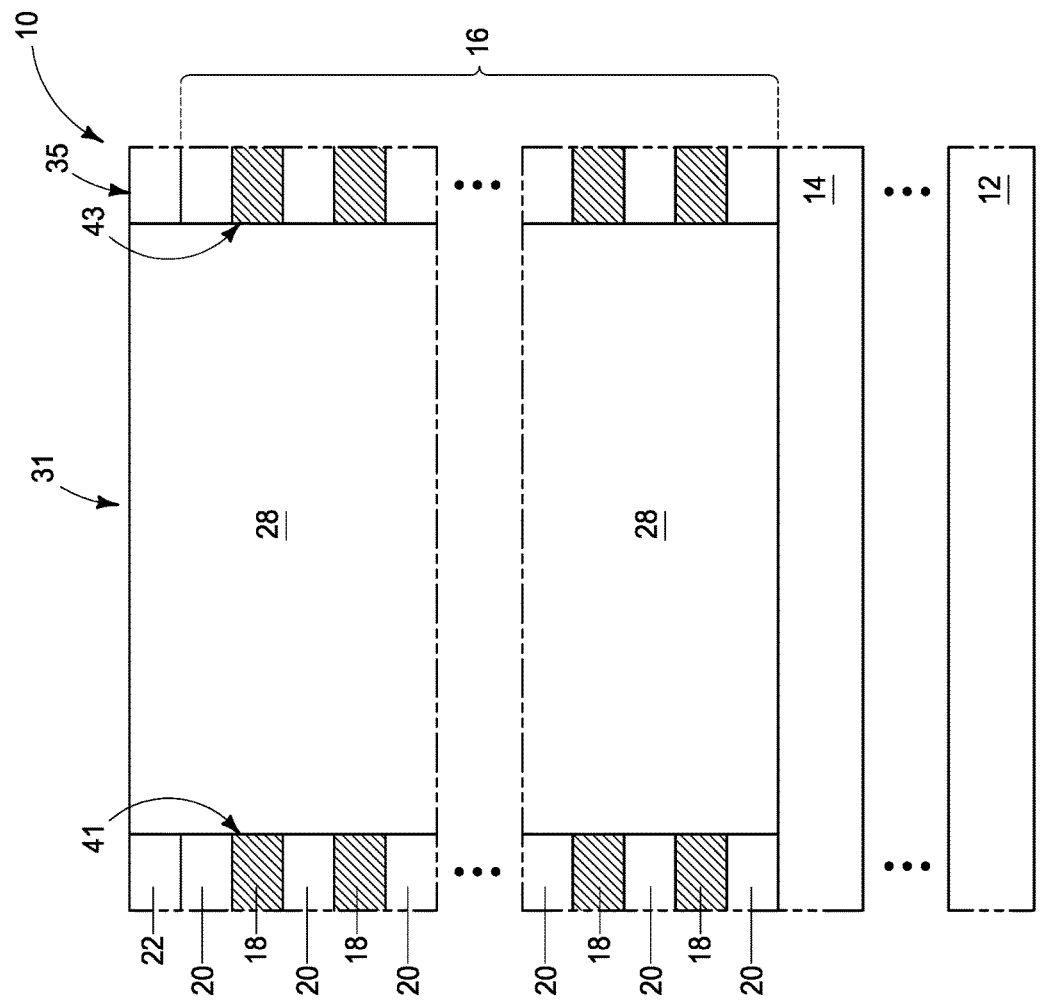

Referring to FIGS. 7-9, electrically insulative fill material 28 is provided within trenches 24-27 (FIGS. 4-6) to form electrically insulative panels 30-33 within such trenches. The fill material may comprise any suitable composition or combination of compositions; and in some embodiments may comprise, consist essentially of, or consist of an electrical insulative oxide, such as, for example, silicon dioxide. The fill material may be formed by any suitable processing, including, for example, atomic layer deposition (ALD), chemical vapor deposition (CVD), and/or physical vapor deposition (PVD). In the shown embodiment, a planarized surface 35 extends across fill material 28 and hardmask 22. Such planarized surface may be formed by any suitable processing. For instance, in some embodiments the fill material 28 may be formed to overfill the trenches 24-27 (FIGS. 4-6), and subsequently chemical-mechanical polishing (CMP) may be utilized to form the planarized surface 35.

In the shown embodiment, the panels 30-33 are rectangularly-shaped. Each panel has a pair of opposing sides 37 and 39 (shown relative to panel 31) which are adjacent to stack 16. The illustrated panels also have a pair of opposing ends 41 and 43 (shown relative to panel 31) which are also adjacent to the stack 16.

The panels 30-33 of FIGS. 7-9 are linear structures which are substantially parallel to one another. Although the panels of FIGS. 4-6 are shown to be separate from one another, in other embodiments (such as, for example, an embodiment described below with reference to FIGS. 33-36) a single serpentining panel may be formed which encompasses linear regions at the locations of panels 30-33.

Figure 10:
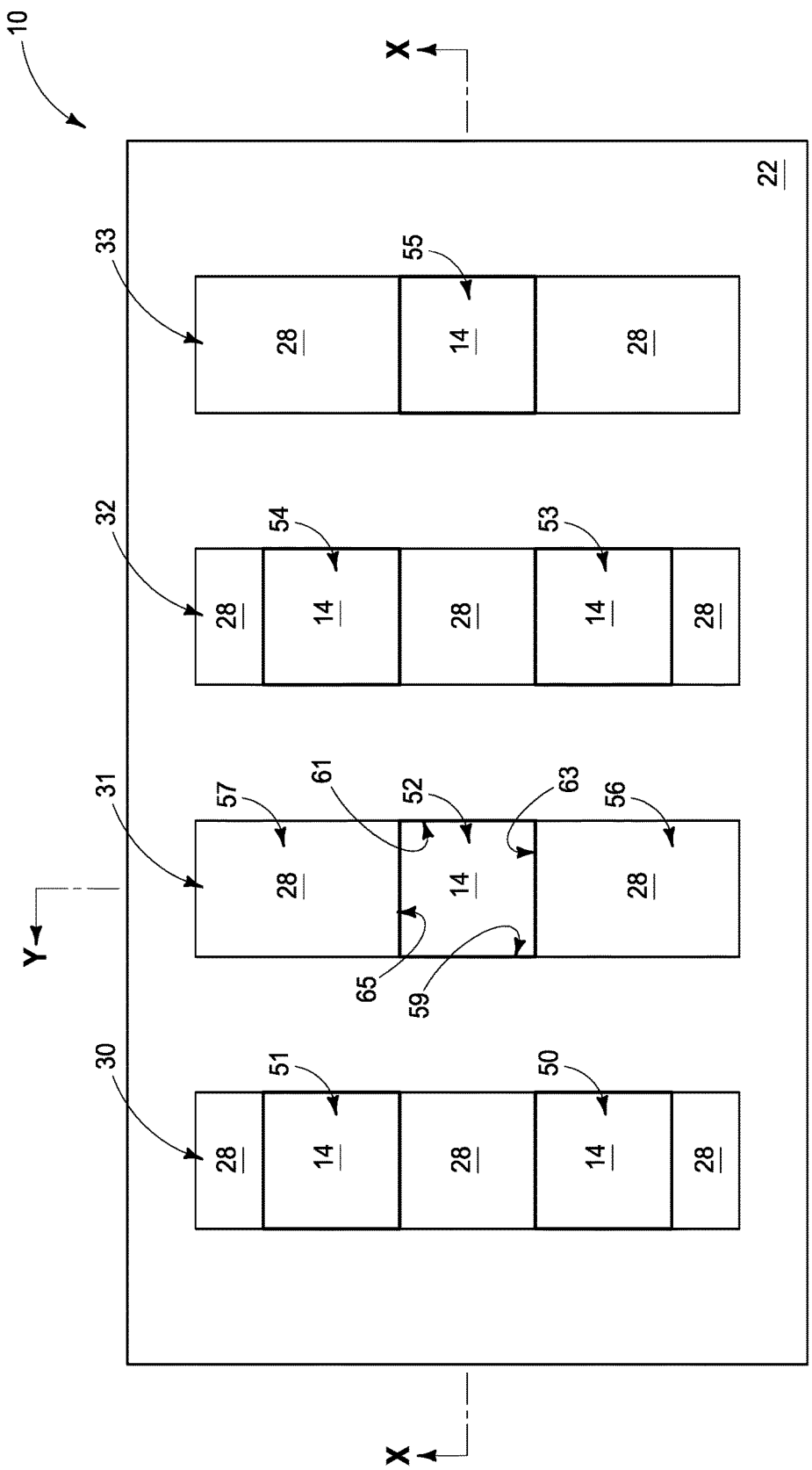
Figure 11:
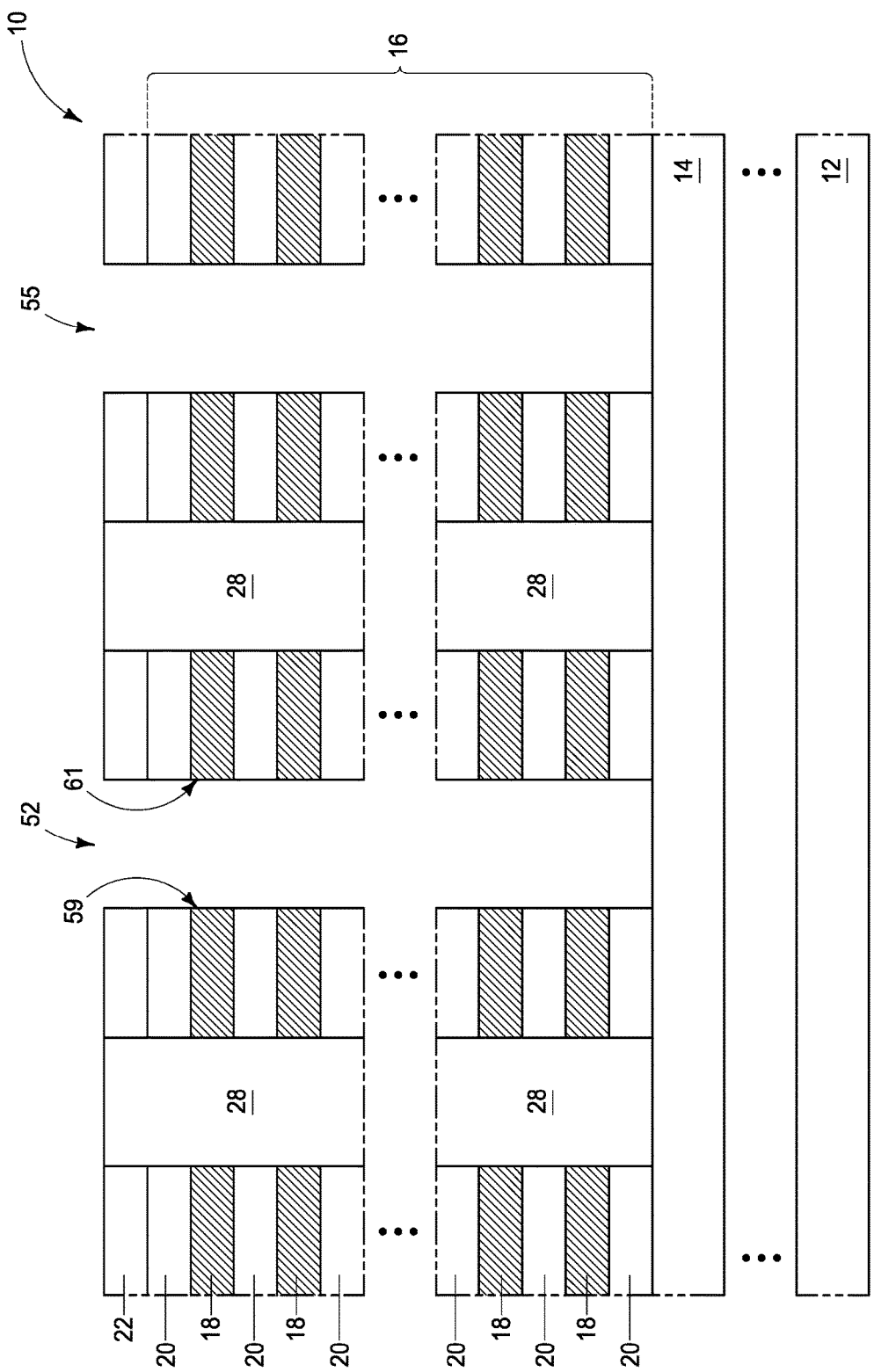
Figure 12:
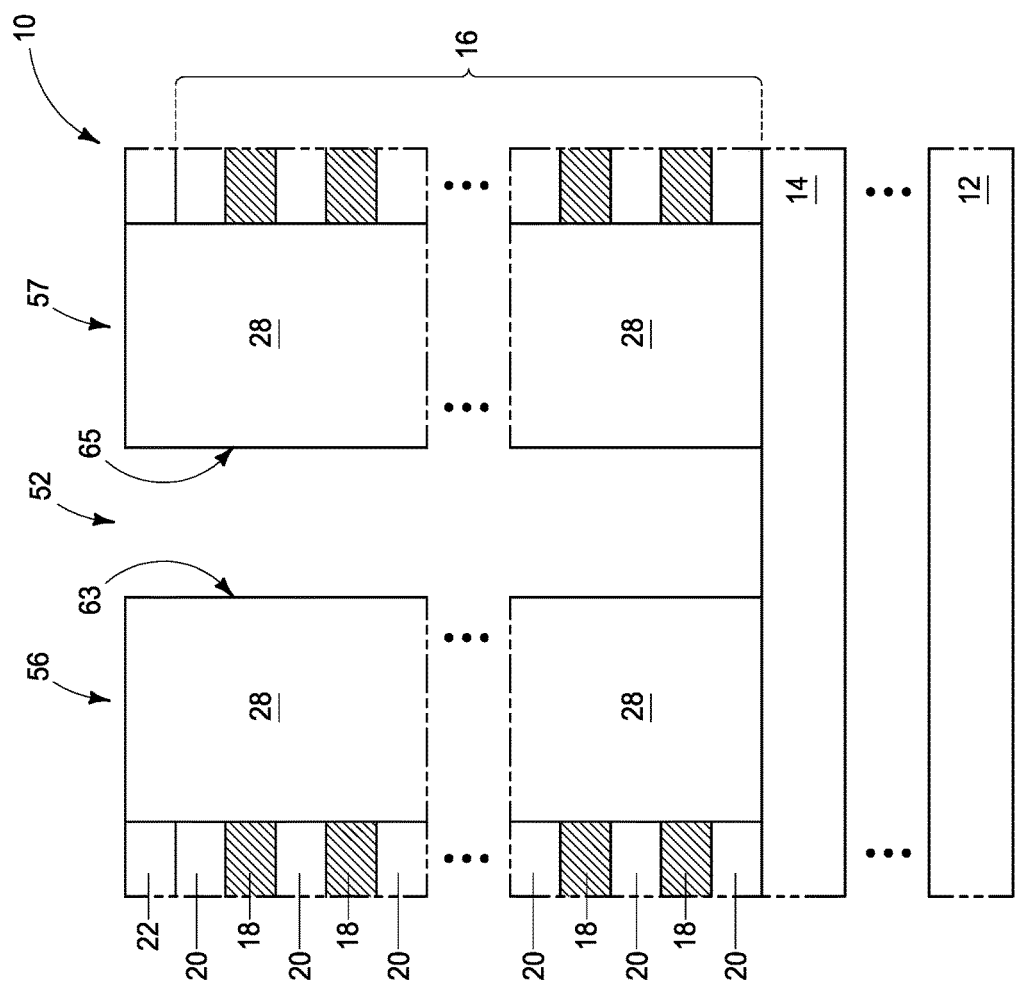

Referring to FIGS. 10-12, openings 50-55 are formed through panels 30-33. The openings may be formed utilizing any suitable processing. For instance, in some embodiments a patterned masking material (not shown) may be formed over the material 28 to define locations of the openings 50-55, and then a pattern may be transferred from the masking material and into material 28 with one or more suitable etches. The patterned masking material may then be removed to leave the construction of FIGS. 10-12. The masking material may comprise any suitable composition, and in some embodiments may comprise a photolithographically-patterned photoresist mask and/or a mask formed utilizing pitch-multiplication methodologies. In some embodiments, other materials (not shown) may be provided between a patterned masking material and the material 28. For instance, if the masking material comprises photolithographically-patterned photoresist, an antireflective material (not shown) and a carbon-containing material (not shown) may be provided between the photoresist and the material 28. Such antireflective material and/or carbon-containing material may be removed during or after formation of the openings 50-55 to leave the construction shown in FIGS. 10-12.

The formation of openings 50-55 may be considered to result from the removal of some sections of panels 30-33. Other sections of the panels remain; and for example panel 31 is shown to comprise sections 56 and 57 remaining on opposing sides of opening 52. In some embodiments, each of the openings 50-55 may be considered to have a first pair of opposing sides along stack 16, and a second pair of opposing sides along remaining sections of the panels 30-33. For instance, opening 52 is shown to comprise a first pair of opposing sides 59 and 61 along stack 16, and to comprise a second pair of opposing sides 63 and 65 along the remaining sections 56 and 57 of panel 31.

The openings 50-55 may have any suitable shape. Although the openings are square in the top view of FIG. 10, in other embodiments the openings may have other shapes. For instance, in some embodiments the openings may be circular or elliptical when viewed in a top view analogous to that of FIG. 10.

In the shown embodiment, the sides of openings 50-55 are substantially vertical. In actual processing, such sidewalls may be tapered.

Figure 13:
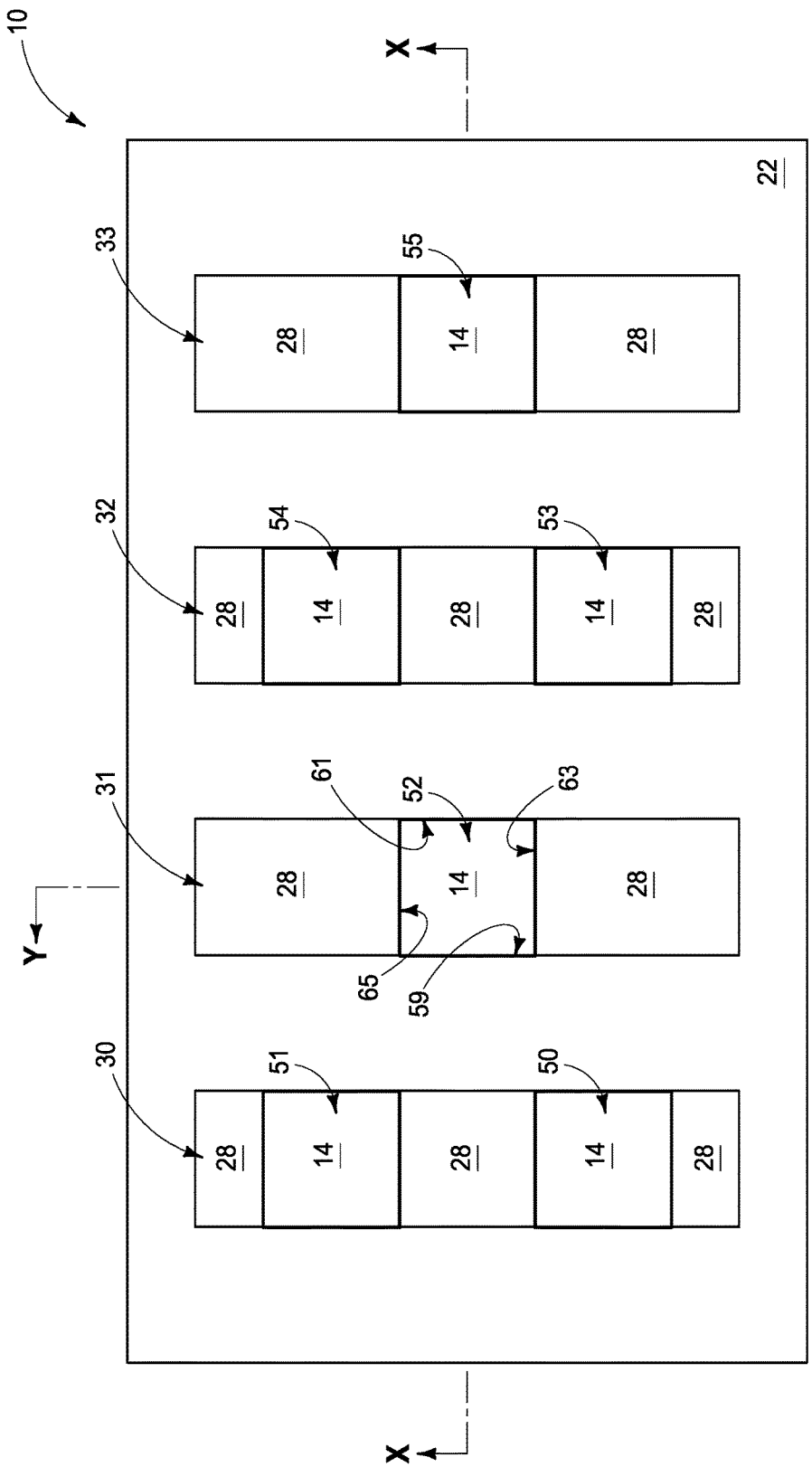
Figure 14:
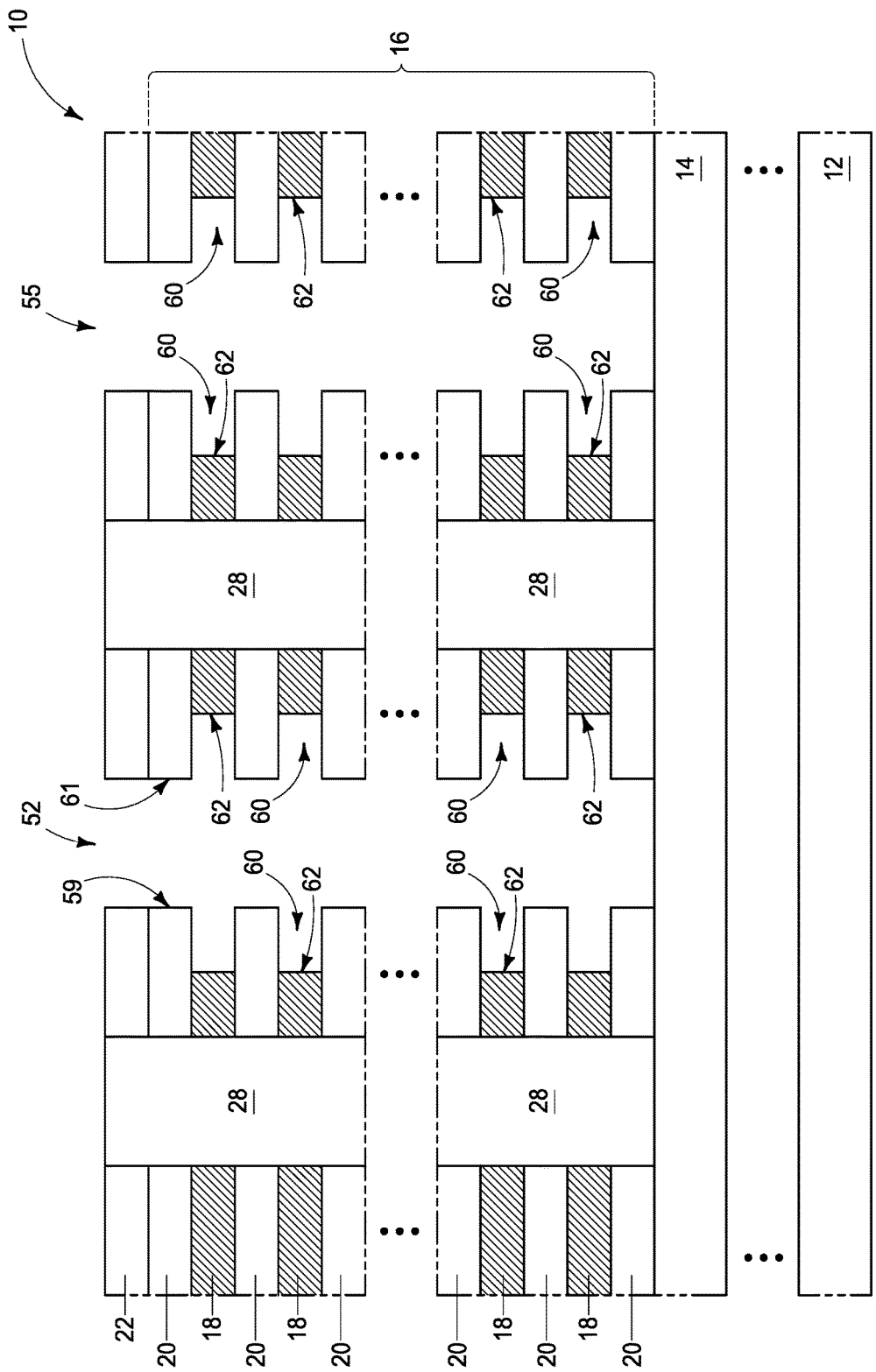
Figure 15:
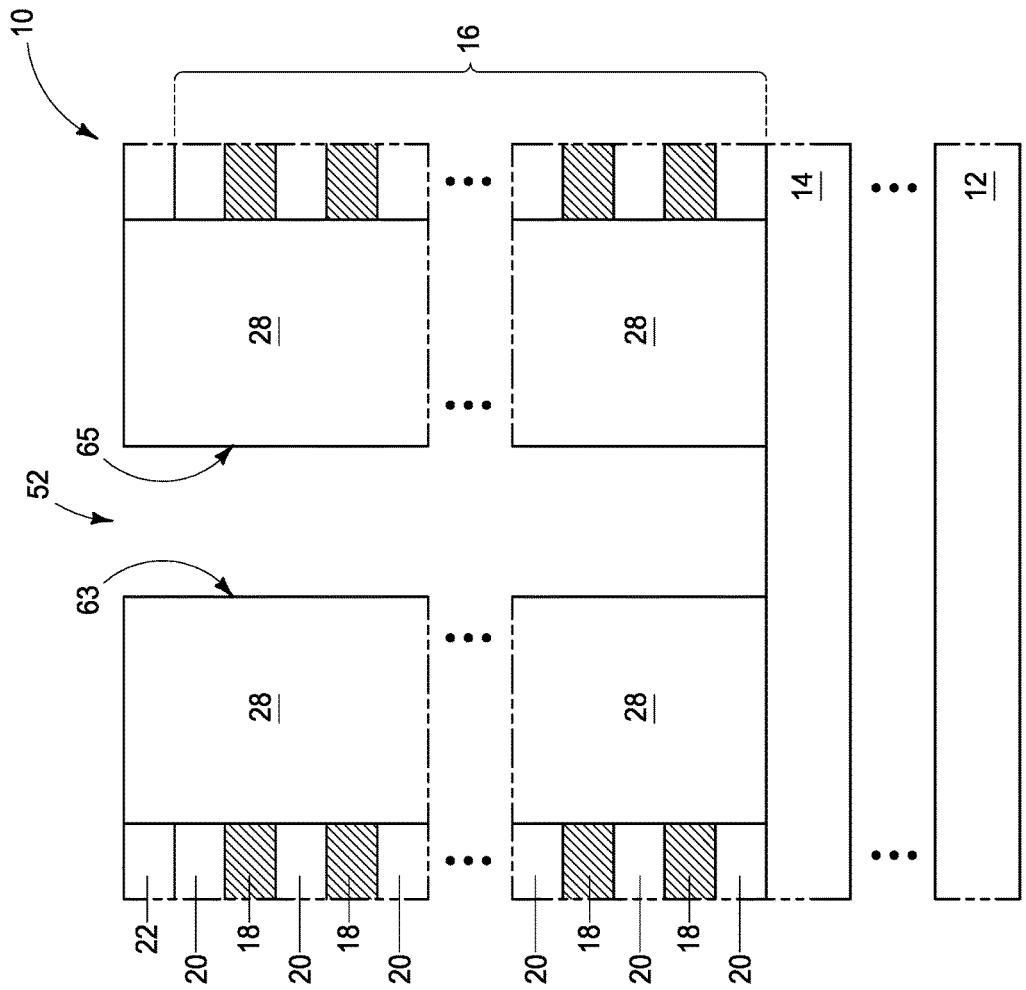

Referring to FIGS. 13-15, the electrically conductive levels 18 are etched along sidewalls of openings 50-55 to form cavities 60 (only some of which are labeled) extending into the conductive levels.

In some embodiments, the electrically conductive levels 18 comprise polycrystalline silicon, the electrically insulative levels 20 and electrically insulative material 28 comprise silicon dioxide, and the formation of cavities 60 utilizes isotropic etching which is substantially selective for polycrystalline silicon relative to silicon dioxide.

The electrically conductive levels 18 have exposed edges 62 (only some of which are labeled) within the cavities 60.

Figure 16:
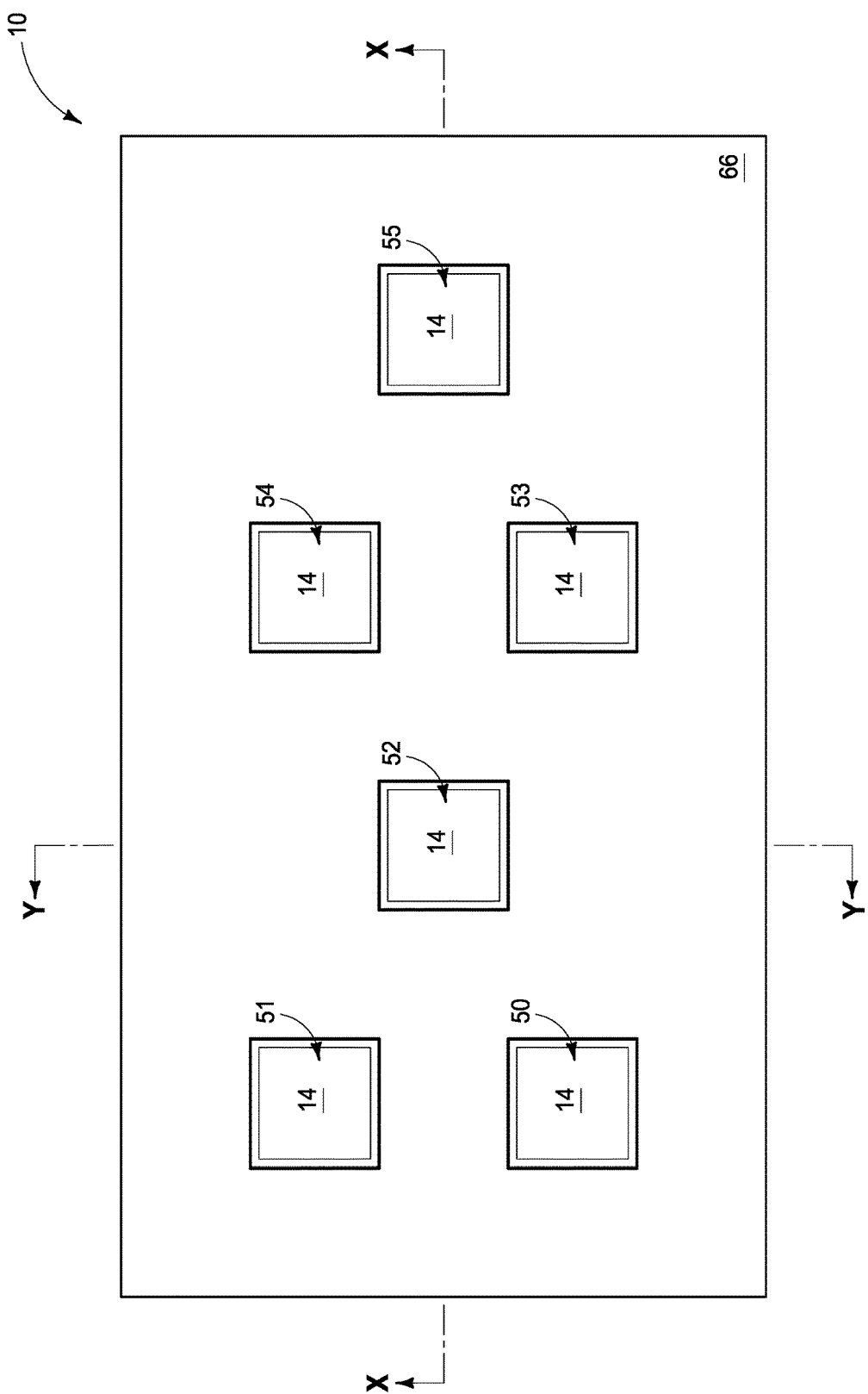
Figure 17:
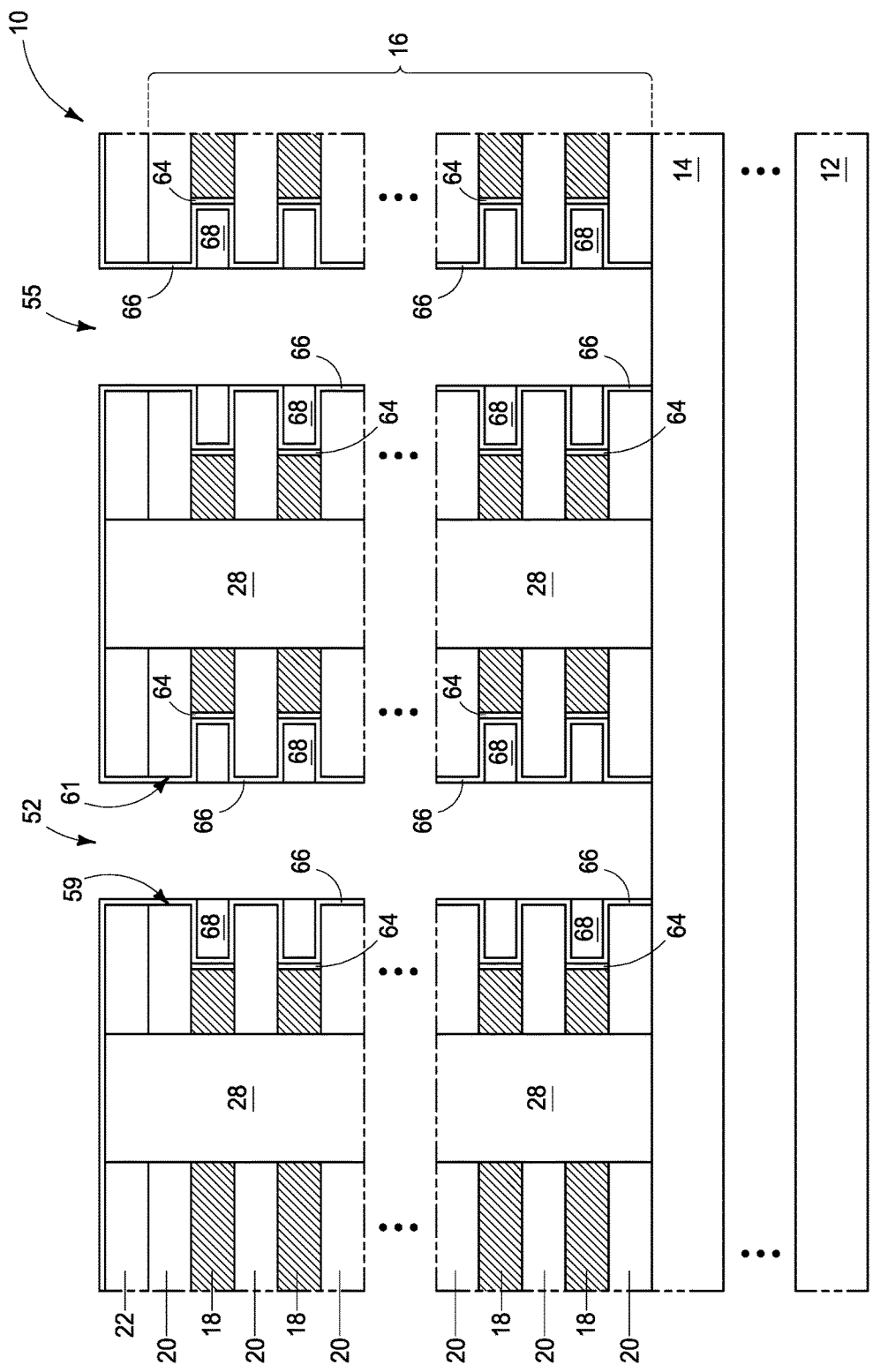
Figure 18:
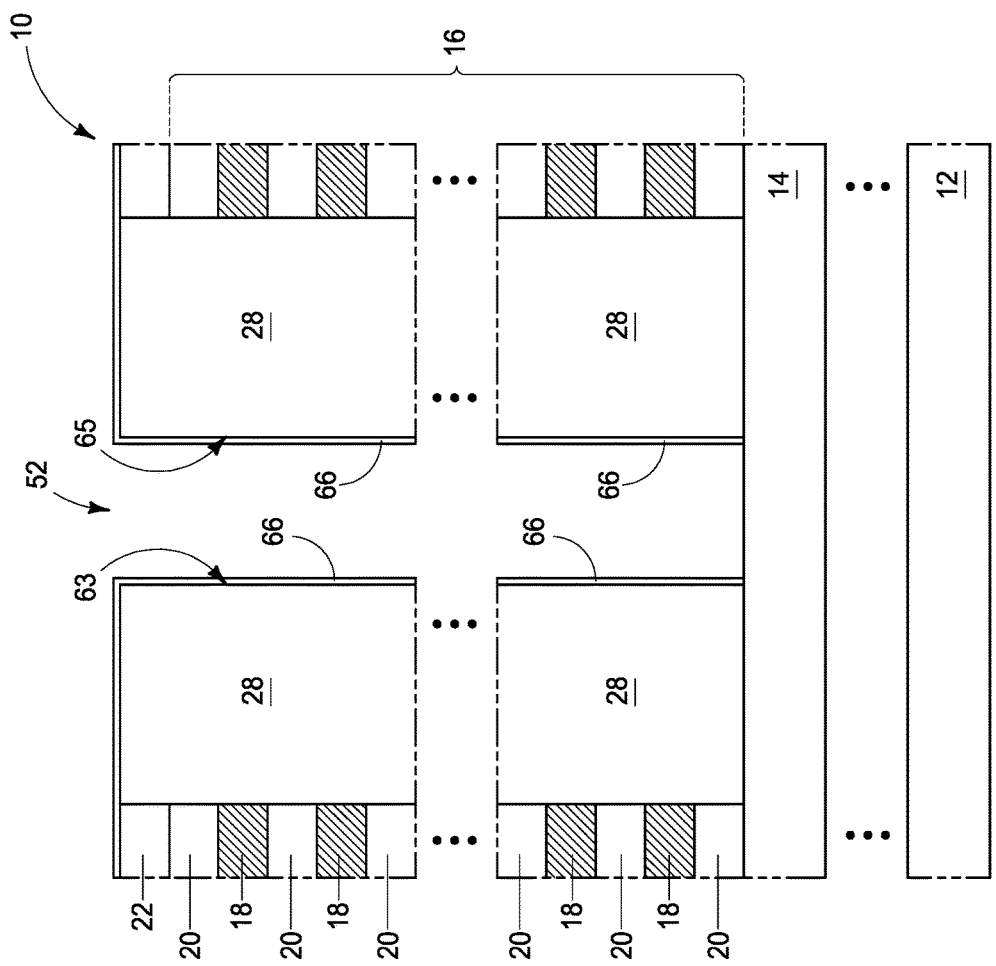

Referring to FIGS. 16-18, first charge blocking material 64 (only some of which is labeled) is formed along the exposed edges 62 (FIGS. 13-15) of conductive levels 18 within cavities 60 (FIGS. 13-15). The first charge blocking material 64 may be electrically insulative, and may comprise any suitable composition. In some embodiments, material 64 may comprise, consist essentially of, or consist of silicon dioxide formed by oxidation of exposed edges of silicon-containing material 18.

Second charge blocking material 66 is formed within openings 50-55 and along the first charge blocking material 64. The second charge blocking material may be electrically insulative, and may comprise any suitable composition. In some embodiments, material 66 may comprise, consist essentially of, or consist of silicon nitride. The second charge blocking material is formed conformally along sidewalls of openings 50-55, and accordingly extends within the cavities 60 (FIGS. 13-15). The second charge blocking material may be formed by any suitable process, including, for example, ALD.

The second charge blocking material within cavities 60 (FIGS. 13 and 15) extends along tops and bottoms of the cavities (as shown in FIG. 17), and also extends along the first charge blocking material 64 at recessed edges of the cavities.

Sacrificial material 68 (only some of which is labeled) is formed within the cavities 60 (FIGS. 13-15) and over the second charge blocking material 66. The sacrificial material 68 may be formed with any suitable method. For instance, the sacrificial material 68 may be formed by one or more of ALD, CVD and PVD. The sacrificial material 68 may be formed to a suitable thickness to overfill the cavities, and then an etch may be utilized to remove excess sacrificial material and thereby leave the sacrificial material primarily within the cavities.

The sacrificial material 68 may comprise any suitable composition. In some embodiments, the sacrificial material may be a carbon-containing material.

Figure 19:
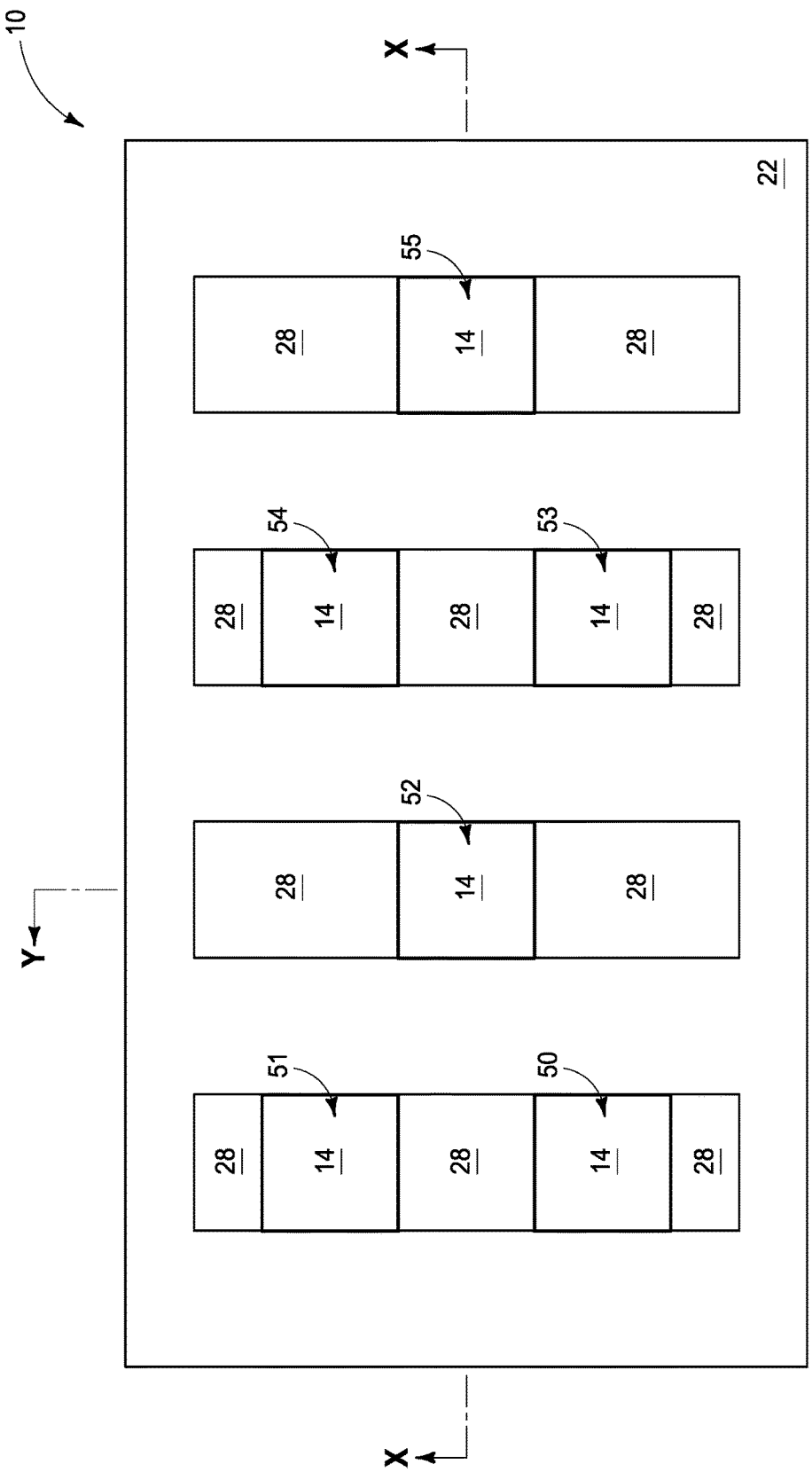
Figure 20:
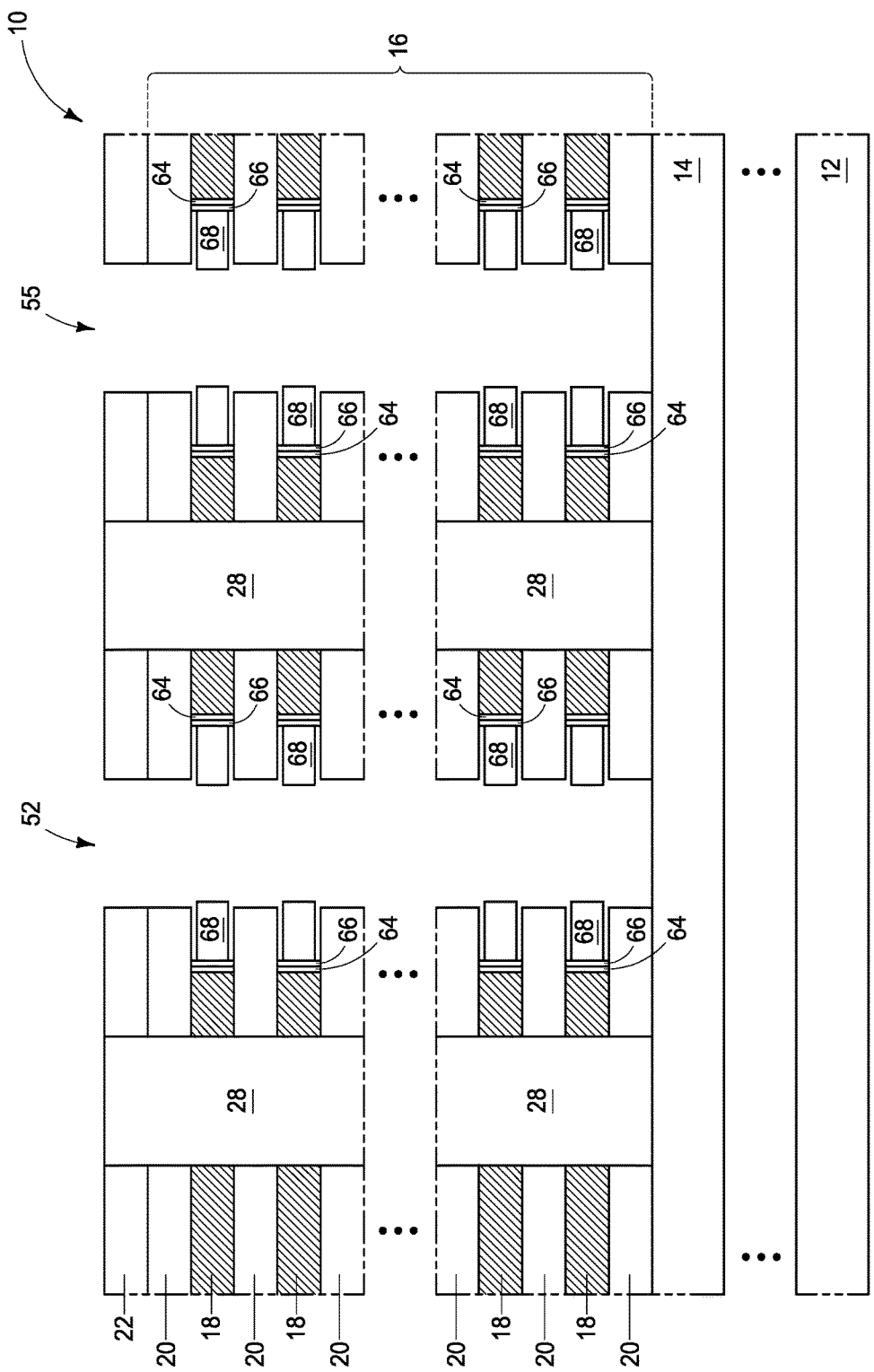
Figure 21:
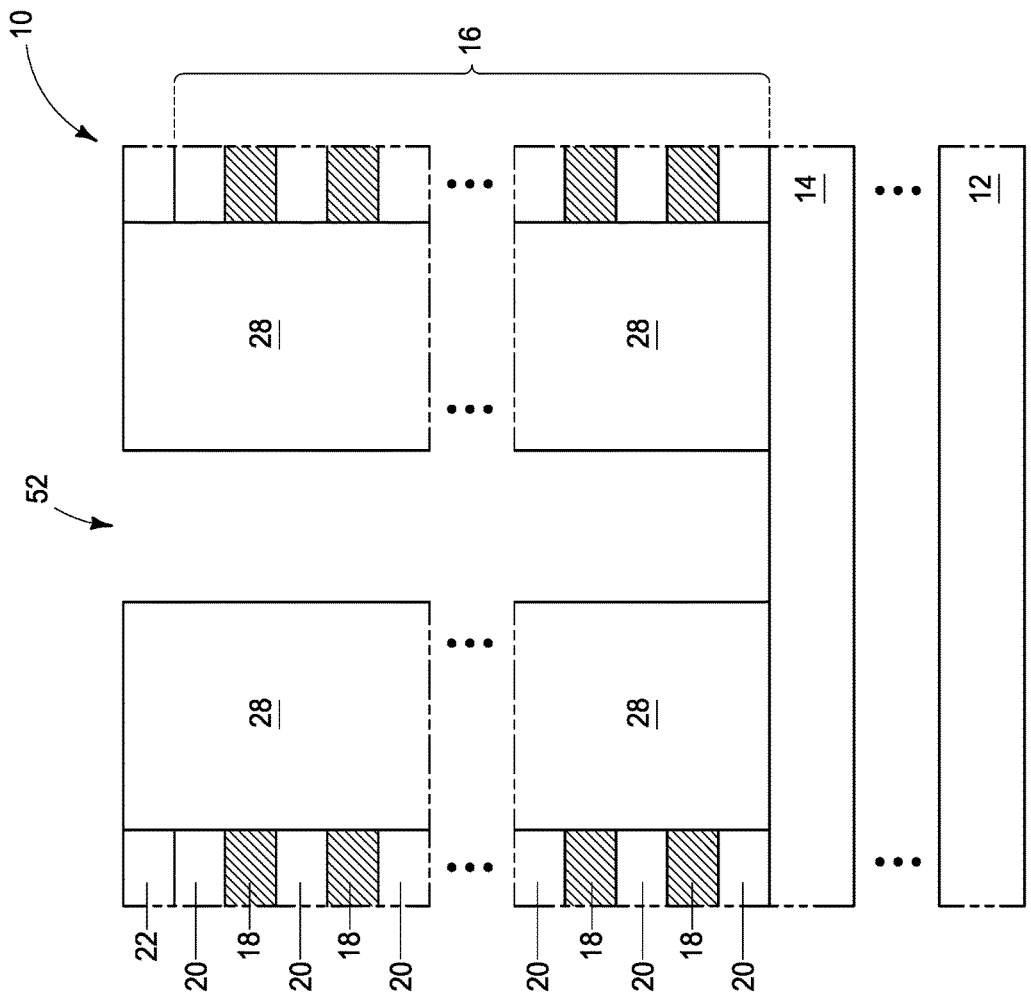

Referring to FIGS. 19-21, an etch is utilized to remove exposed regions of material 66 from above and below sacrificial material 68 within cavities 60 (the cavities are labeled in FIG. 14), while the sacrificial material protects portions of material 66 at the backs of the cavities. The etch may be any suitable etch for selectively removing material 66 relative to material 68. In some embodiments, both the charge blocking material 66 and hardmask material 22 comprise silicon nitride, and in such embodiments some etching of the hardmask material may occur during the etching of material 66.

Figure 22:
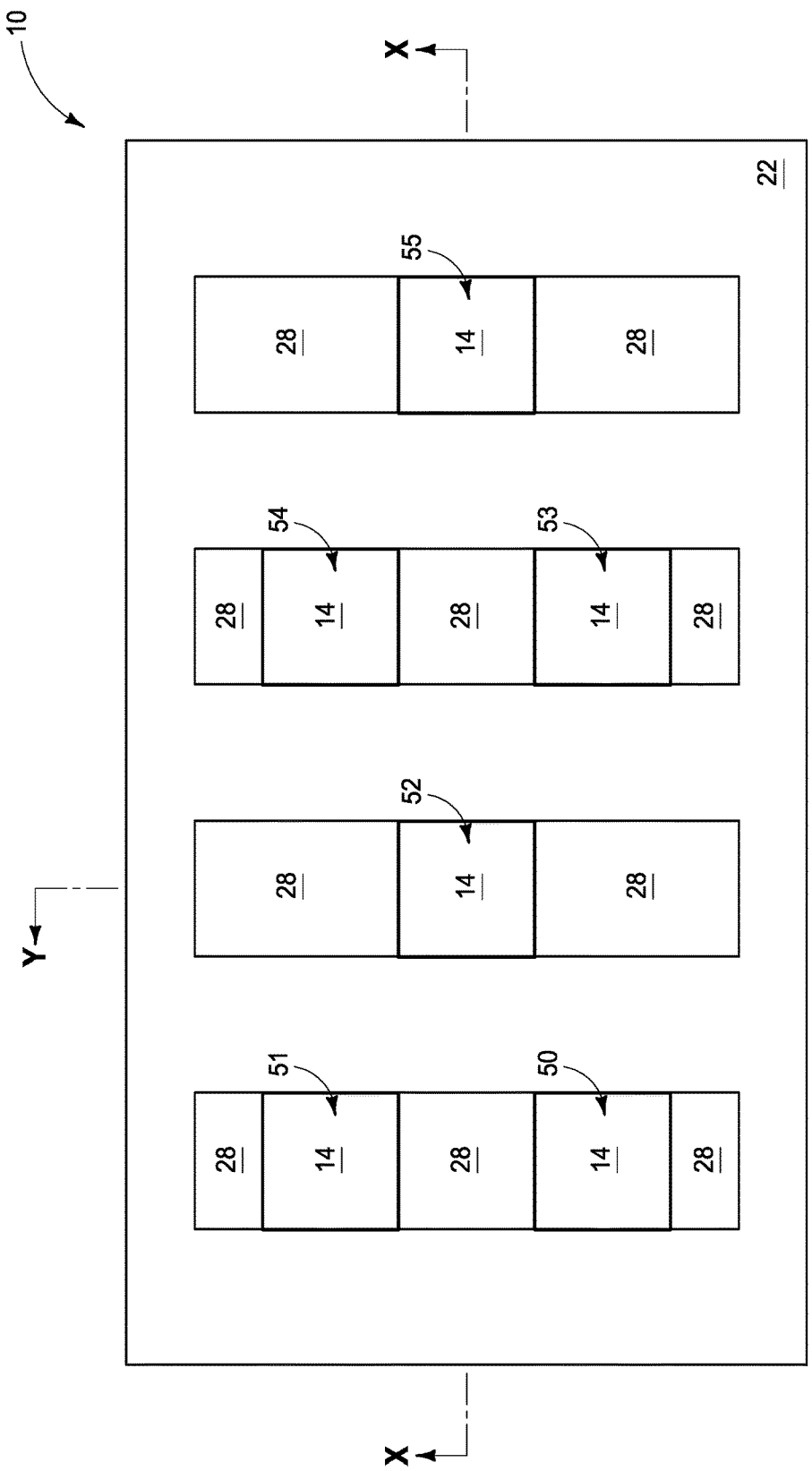
Figure 23:
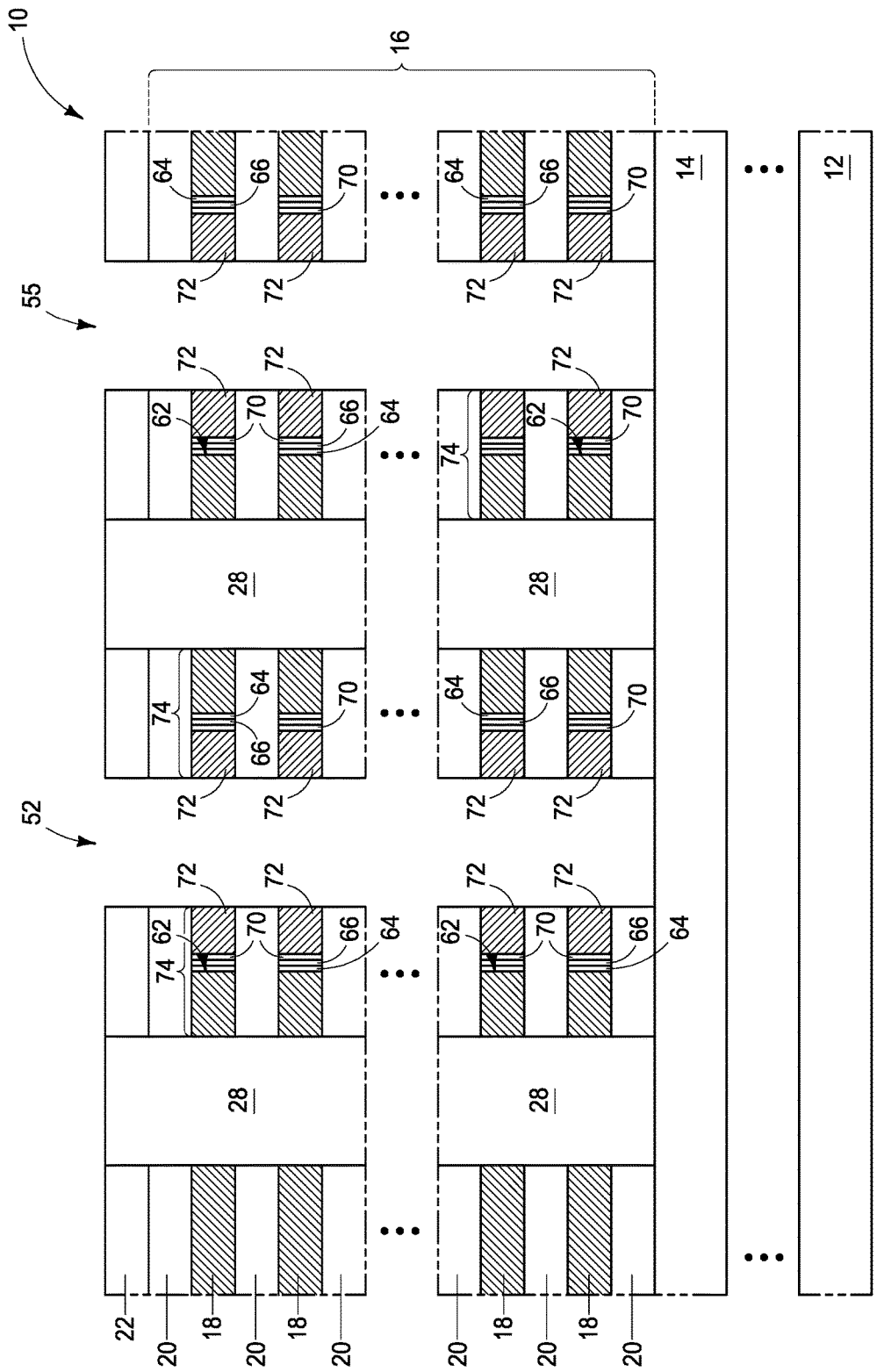
Figure 24:
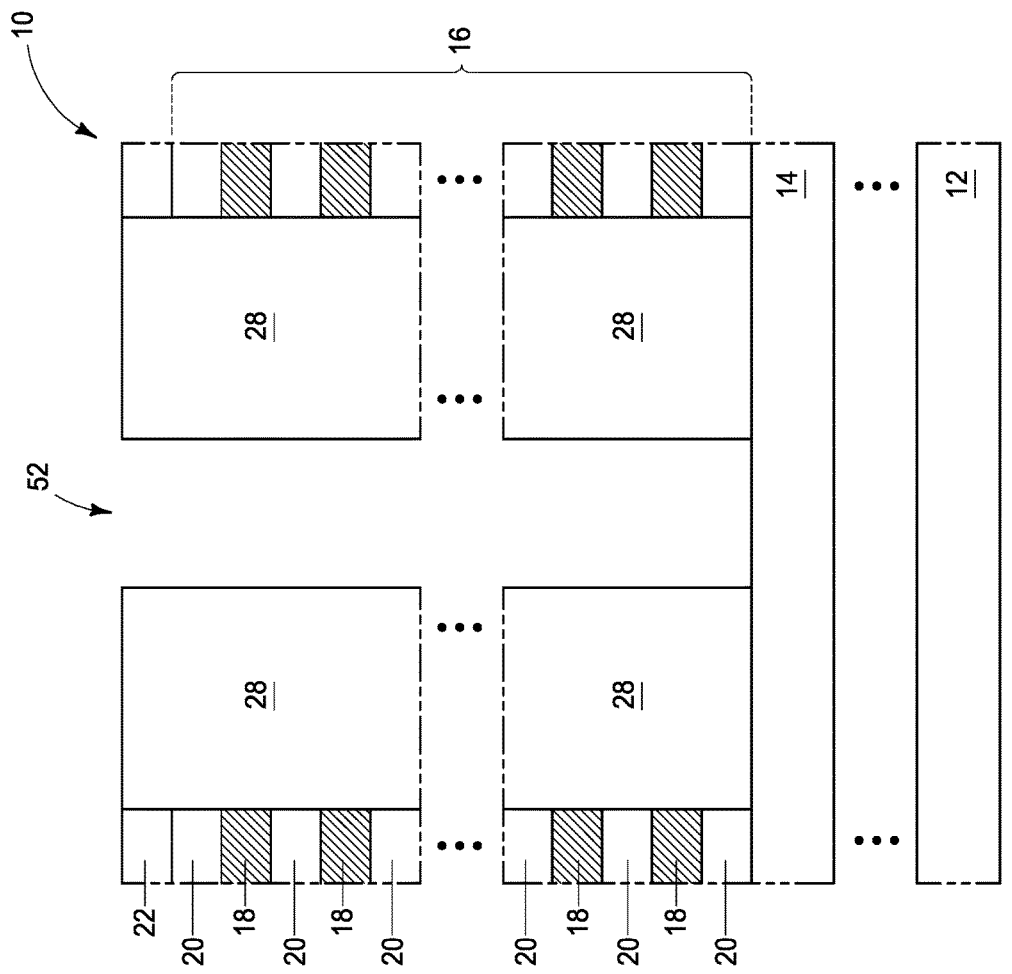

Referring to FIGS. 22-24, sacrificial material 68 (FIGS. 19-21) is removed. Such removal may utilize any suitable processing. For instance, if the sacrificial material is a carbon-containing material, removal of the sacrificial material may comprise oxidation of such carbon-containing material.

A third charge blocking material 70 (only some of which is labeled) is formed along the second charge blocking 68 (only some of which is labeled). The material 70 may be electrically insulative. Material 70 may be formed utilizing any suitable processing, including, for example, one or more of ALD, CVD and PVD; and/or oxidation of an exposed surface of material 66. In some embodiments, the charge blocking materials 64, 66 and 70 may comprise silicon dioxide, silicon nitride and silicon dioxide, respectively. In such embodiments, such materials may be considered to form a silicon nitride structure (the structure comprising material 66) sandwiched between a pair of silicon dioxide structures (the structures comprising materials 64 and 70). All of such structures are planar in the shown embodiment, and specifically are planar vertical structures extending along planar vertical edges 62 (only some of which are labeled) of conductive levels 18. In other embodiments (not shown) one or more of materials 64, 66 and 70 may extend along top and bottom surfaces of the cavities 60 (the cavities are labeled in FIG. 14), and accordingly one or more of the structures comprising such materials may not be planar. For instance, in some embodiments the sacrificial material 68 (FIGS. 17 and 20) may be omitted, and thus the charge blocking material 66 may remain along top and bottom surfaces of the cavities, rather than being processed into the illustrated planar structure of FIG. 23.

Charge-storage material 72 (only some of which is labeled) is formed within the cavities 60 (the cavities are labeled in FIG. 14). The charge-storage material 72 may comprise any suitable composition; and may, for example, comprise floating gate material (for instance, polycrystalline silicon) or charge-trapping material (for instance, silicon nitride, nanodots, etc.). In some embodiments, the charge-storage material may be electrically conductive material.

An advantage of utilizing charge blocking materials 64, 66 and 70 configured as planar structures is that the charge-storage material 72 has a same thickness along the cross-section of FIG. 23 as the control gate material of levels 18. Ultimately, memory cells 74 (only some of which are labeled) are formed to comprise the control gate material, charge-trapping material, and charge blocking material between the control gate material and charge-trapping material. It can be advantageous that the control gate material and charge-trapping material have a common thickness as one another within such memory cells to improve electrical coupling between the control gate material and charge-trapping material relative to other constructions having different relative thicknesses between the control gate material and the charge-trapping material. The improved electrical coupling may lead to improved operational characteristics, such as, for example, improved retention and/or improved switching.

The charge-storage material may be formed in the shown configuration with any suitable processing. For instance, the charge storage material may be initially provided to a thickness which overfills the cavities, and then subjected to an etch which removes excess charge-storage material to leave the charge-storage material only within the cavities.

Although three charge blocking materials (64, 66 and 70) are shown formed between the control gate material of levels 18 and the charge-storage material 72, in other embodiments there may be more than three charge blocking materials, or less than three charge blocking materials. Generally, there will be at least one charge blocking material. The charge blocking material may comprise any suitable composition or combination of compositions; including, for example, one or more of silicon nitride, silicon dioxide, hafnium oxide, zirconium oxide, etc.

Figure 25:
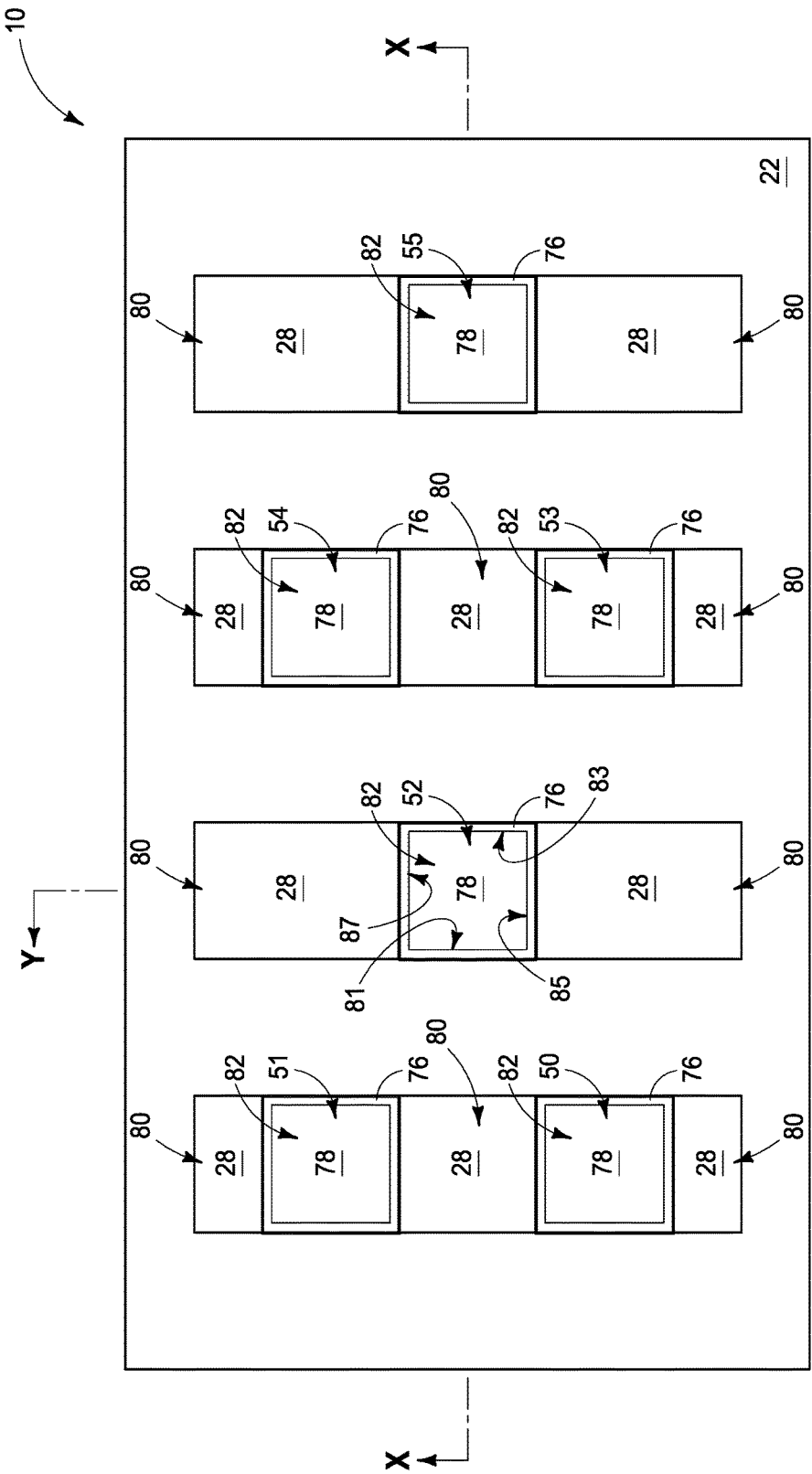
Figure 26:
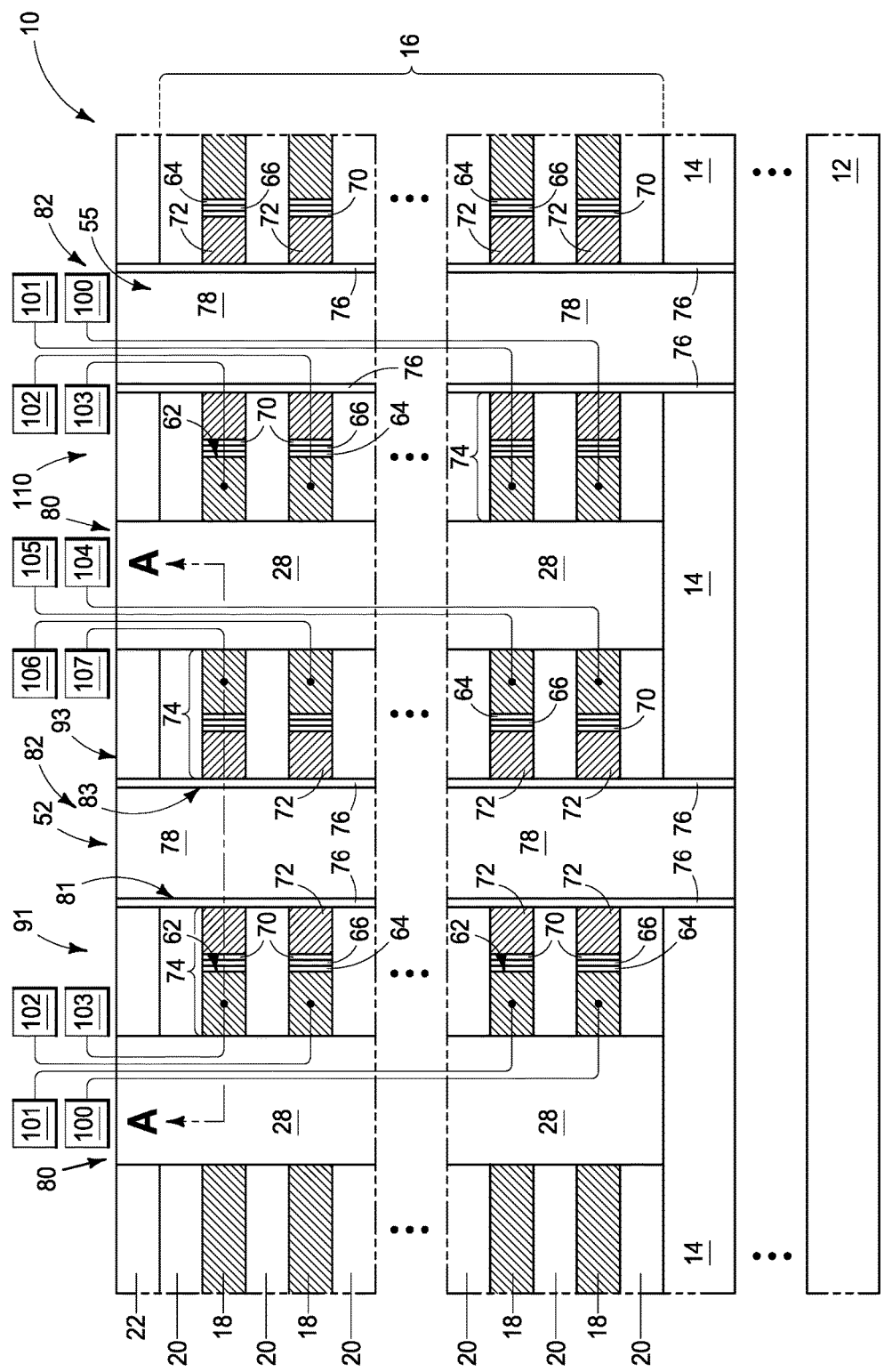
Figure 27:
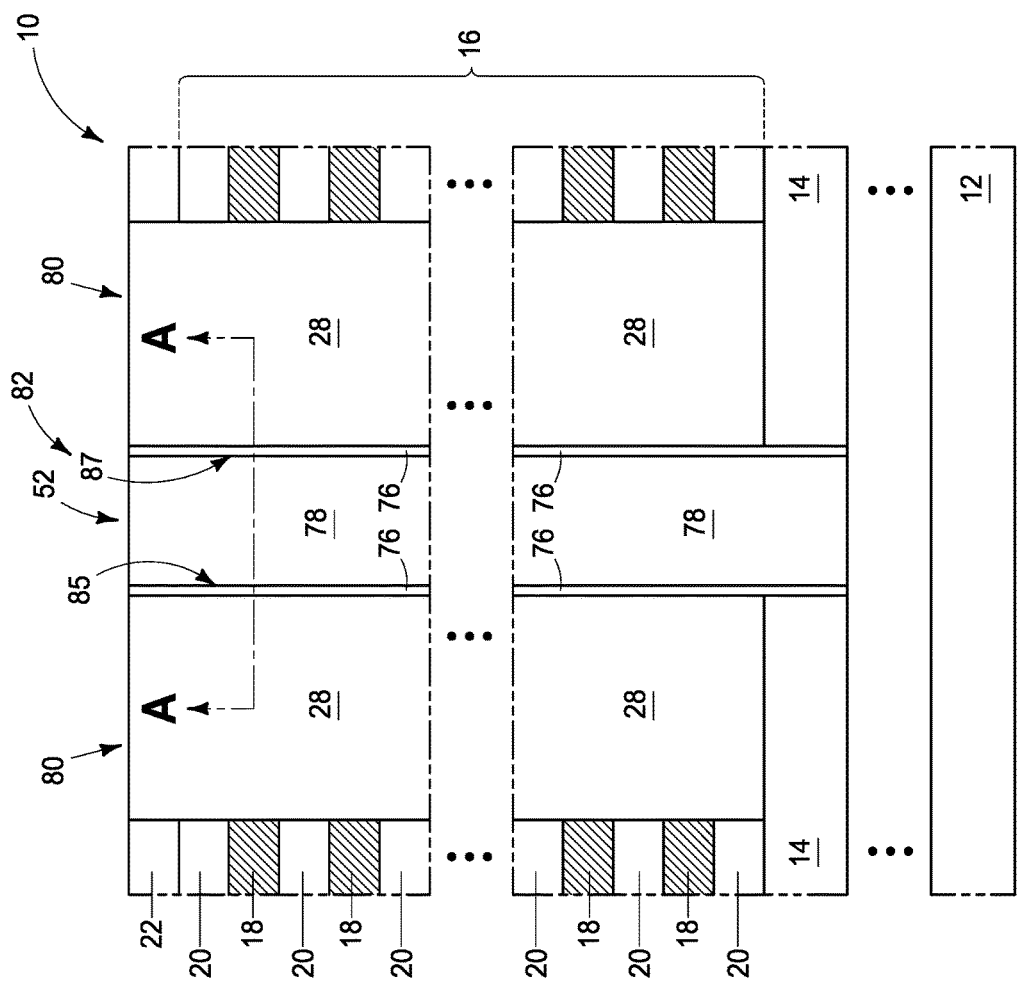

Referring to FIGS. 25-27, the openings 50-55 are extended through material 14, gate dielectric material 76 is formed within the openings 50-55 to line the openings, and then channel material 78 is formed within openings 50-55 and along the gate dielectric material.

The gate dielectric material may comprise any suitable composition or combination of compositions; and in some embodiments may comprise, consist essentially of, or consist of one or more of silicon dioxide, hafnium oxide, zirconium oxide, aluminum oxide, etc. In the shown embodiment, the gate dielectric material lines sidewalls of openings 50-55, and accordingly may be considered to be configured as gate dielectric liners within such openings. In other embodiments, the gate dielectric material may be selectively formed only along surfaces of charge-storage material 72 by, for example, oxidizing such surfaces. In the shown embodiment, the gate dielectric material 76 is between the channel material 78 and the electrically insulative material 28. In other embodiments in which the gate dielectric material is formed by oxidizing surfaces of charge-storage material 72, such gate dielectric material may not be between the channel material 78 and the electrically insulative material 28. In such other embodiments, the channel material 78 may be directly against electrically insulative material 28 at a processing stage analogous to that of FIGS. 25-27.

The channel material 78 may comprise any suitable composition, or combination of compositions, and in some embodiments may comprise, consist essentially of, or consist of appropriately-doped silicon (e.g., conductively-doped polycrystalline silicon).

The memory cells 74 (only some of which is labeled) are along the channel material. In operation, vertically-stacked memory cells 74 may be incorporated into vertical NAND strings. Such vertical NAND strings may include select gates (for instance, drain side select gates and source side select gates) which are provided above and below the vertically-stacked memory cells (the select gates are not shown). In some embodiments, a plurality of vertical NAND strings may be formed across a semiconductor substrate to form a NAND memory array.

In some embodiments, the construction 10 of FIGS. 25-27 may be considered to be a NAND construction having material 28 configured as electrically insulative pillars 80 extending through the stack 16. The construction further comprises channel material 78 configured as channel material posts 82 extending through the stack 16, with the channel material posts being between the electrically insulative pillars 80. Each of the posts may be considered to comprise a first pair of opposing sides 81 and 83 (shown relative to a post within opening 52, and a second pair of opposing sides 85 and 87 (also shown relative to the post within opening 52).

The individual sides of the first pair of opposing sides are spaced from adjacent pillars 80 by intervening regions of stack 16 (shown in FIG. 26, where intervening regions of the stack are labeled as a region 91 between side 81 and one of the pillars 80, and a region 93 between side 83 and another of the pillars 80).

Each of the sides of the second pair of opposing sides 85 and 87 does not have any of the materials of stack 16 between it and the adjacent pillars 80, as can be seen in FIG. 27.

The cavities 60 (labeled in FIG. 14) extend into the electrically conductive levels along the first pair of opposing sides 81 and 83 of the channel material posts. The charge blocking materials 64, 66 and 70 (only some of which are labeled in FIG. 26) are along edges of the electrically conductive levels within the cavities, and the charge-storage material 72 (only some of which is labeled in FIG. 26) is within the cavities and spaced from the electrically conductive levels by the charge blocking materials. The gate dielectric 76 is between the charge-storage material 72 and the channel material posts 82.

Figure 28:
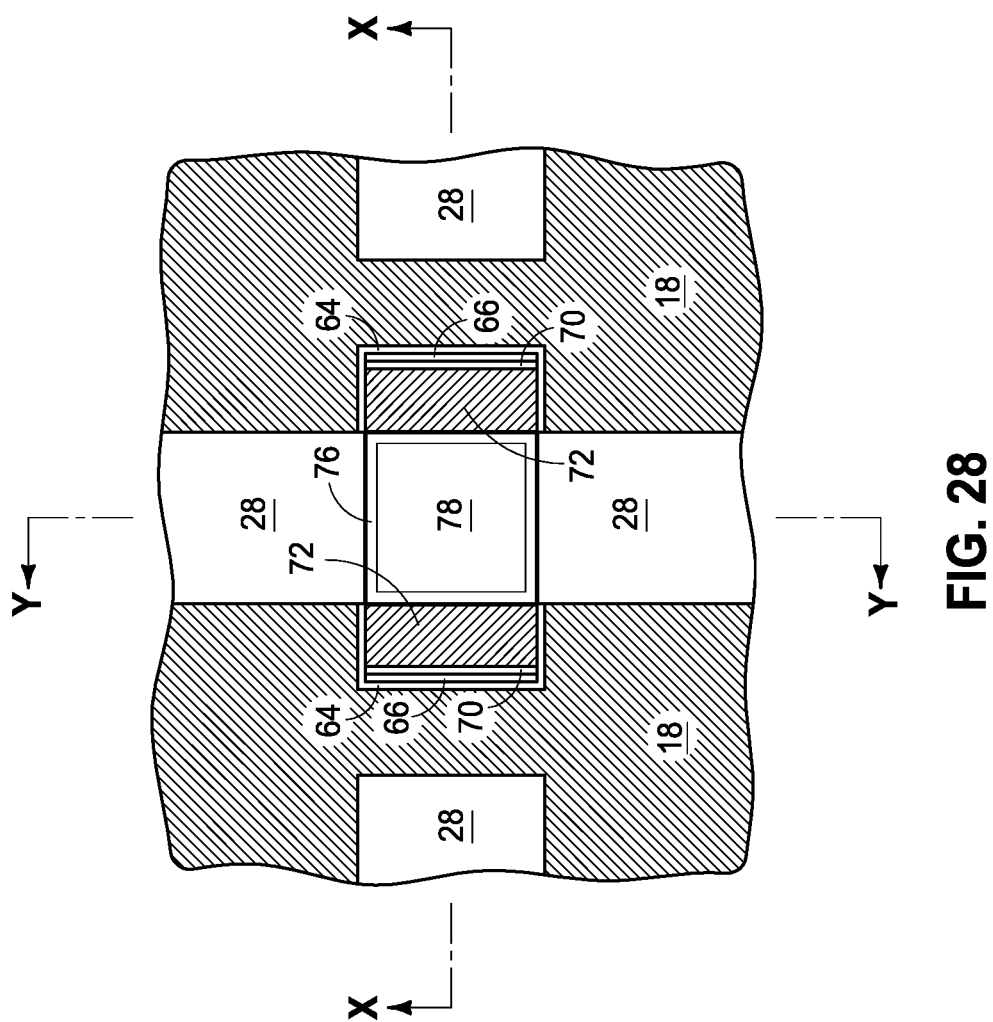
FIG. 28 is a diagrammatic view of a fragment along the lines A-A of FIGS. 26 and 27 illustrating an example embodiment.

FIG. 28 shows a view of a fragment along the lines A-A of FIGS. 26 and 27 to illustrate that in some example embodiments the electrically insulative charge blocking material 64 may be formed by oxidation (or other suitable chemical modification) of exposed surfaces of conductive material 18, and accordingly may laterally surround all of the materials 66, 70 and 72 at the processing stage of FIGS. 26 and 27. The electrically insulative charge blocking material 64 may thus be utilized to prevent shorting between materials 72 and 18 along sides of the cavities 60 (with the cavities 60 being shown in, for example, FIG. 14).

Figure 29:
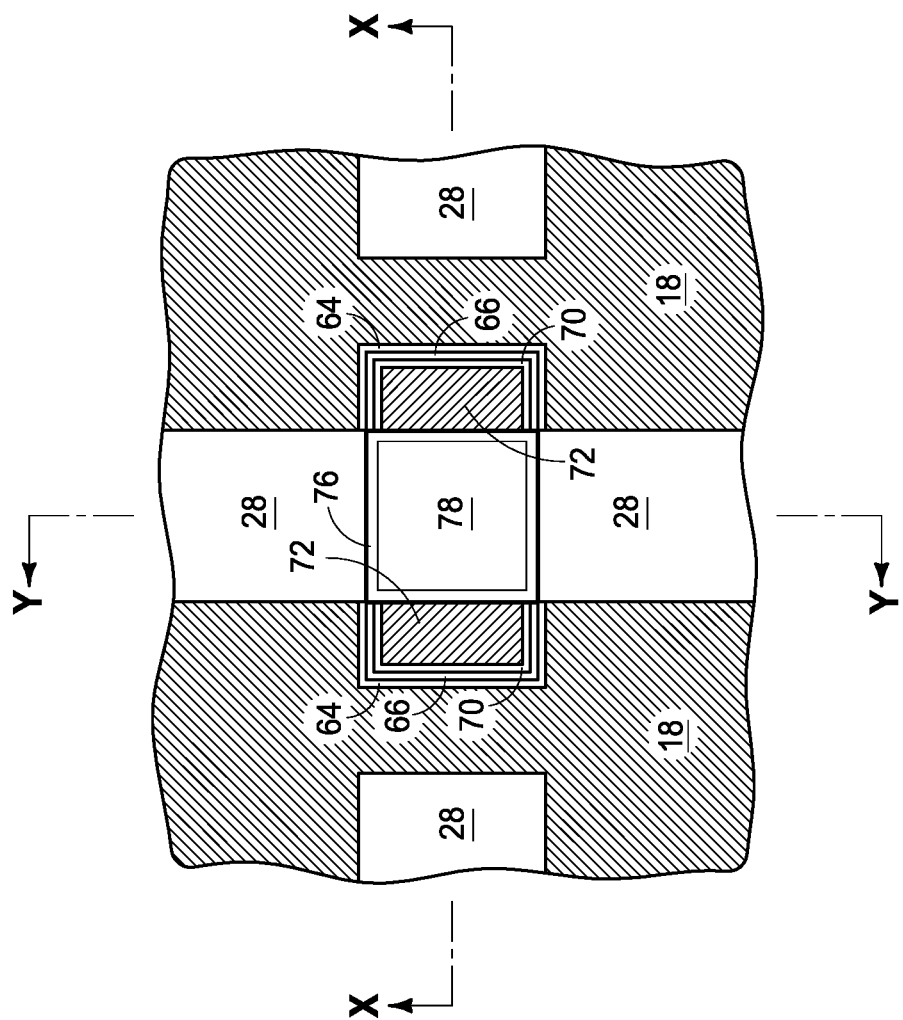
FIG. 29 is a diagrammatic view of a fragment along the lines A-A of FIGS. 26 and 27 illustrating an example embodiment alternative to that of FIG. 28.

FIG. 29 shows a view of a fragment along the lines A-A of FIGS. 26 and 27 in accordance with an example embodiment alternative to that of FIG. 28; and shows that all of the charge blocking materials 64, 66 and 70 may be formed to laterally surround material 72 at the processing stage of FIGS. 26 and 27. In other embodiments alternative to FIGS. 28 and 29, other configurations may be formed to have one or more of the charge blocking materials 64, 66 and 70 laterally surrounding material 72.

Figure 30:
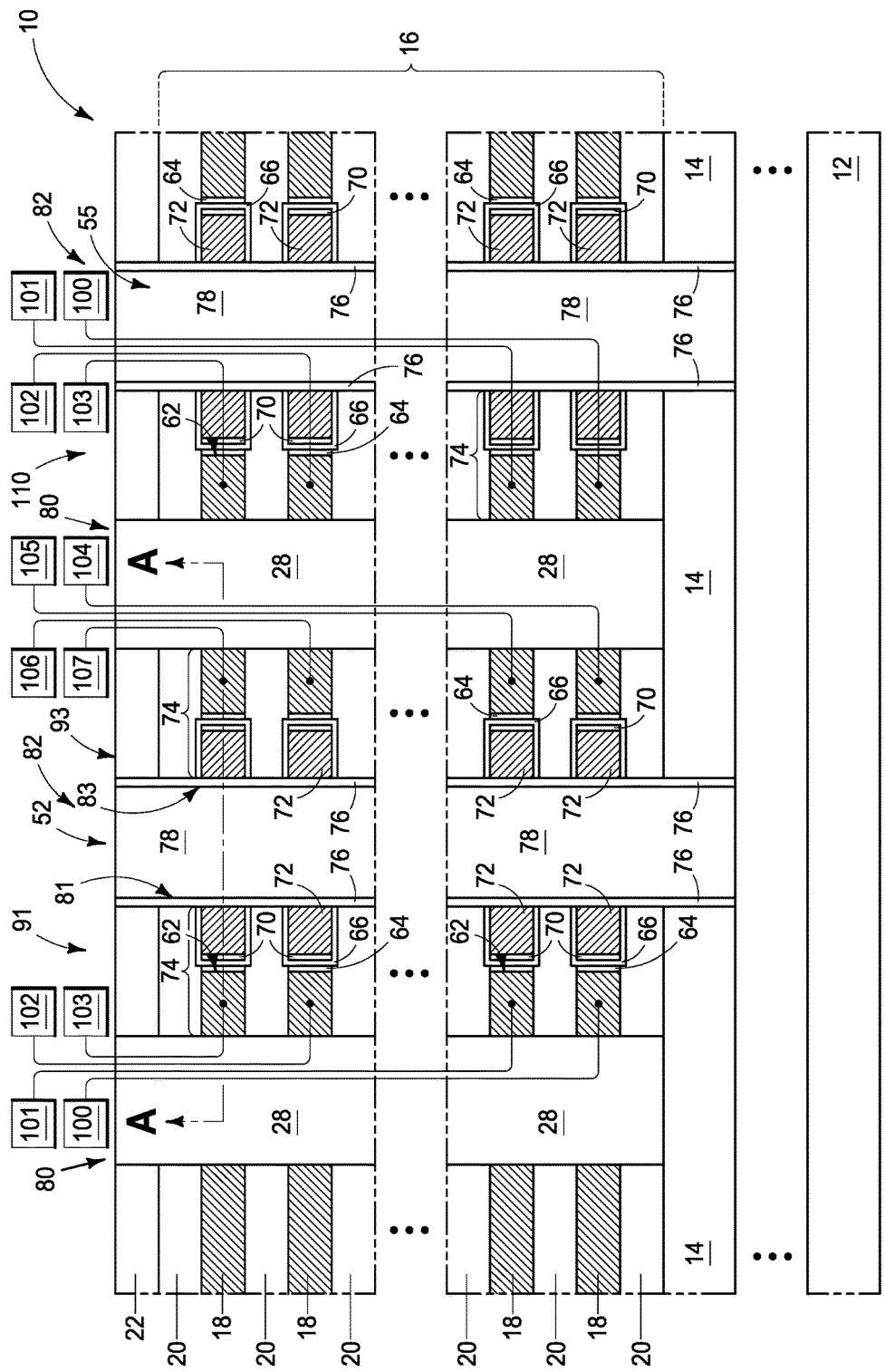
FIGS. 30 and 31 are diagrammatic cross-sectional views along the lines X-X and Y-Y respectively of FIG. 25 illustrating an example embodiment alternative to that of FIGS. 26 and 27.
Figure 31:
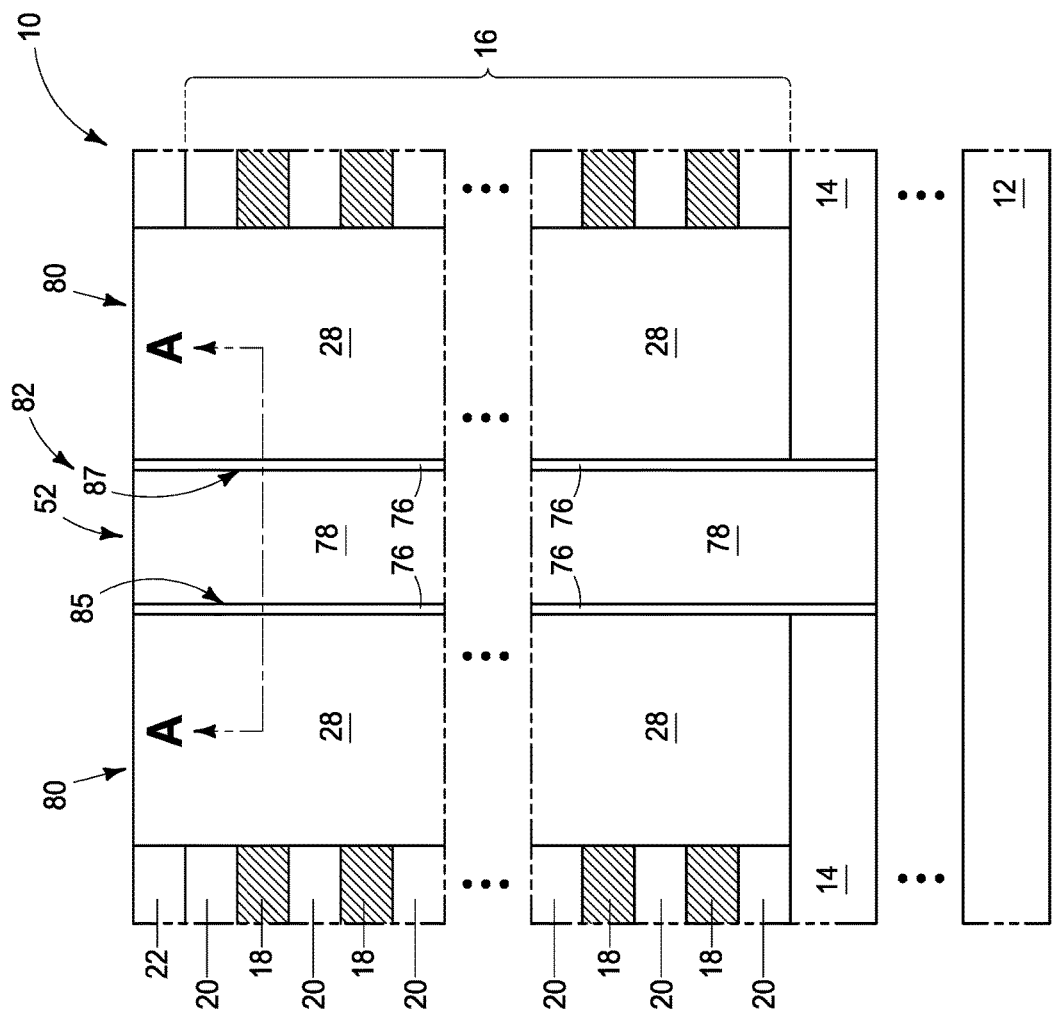
Figure 32:
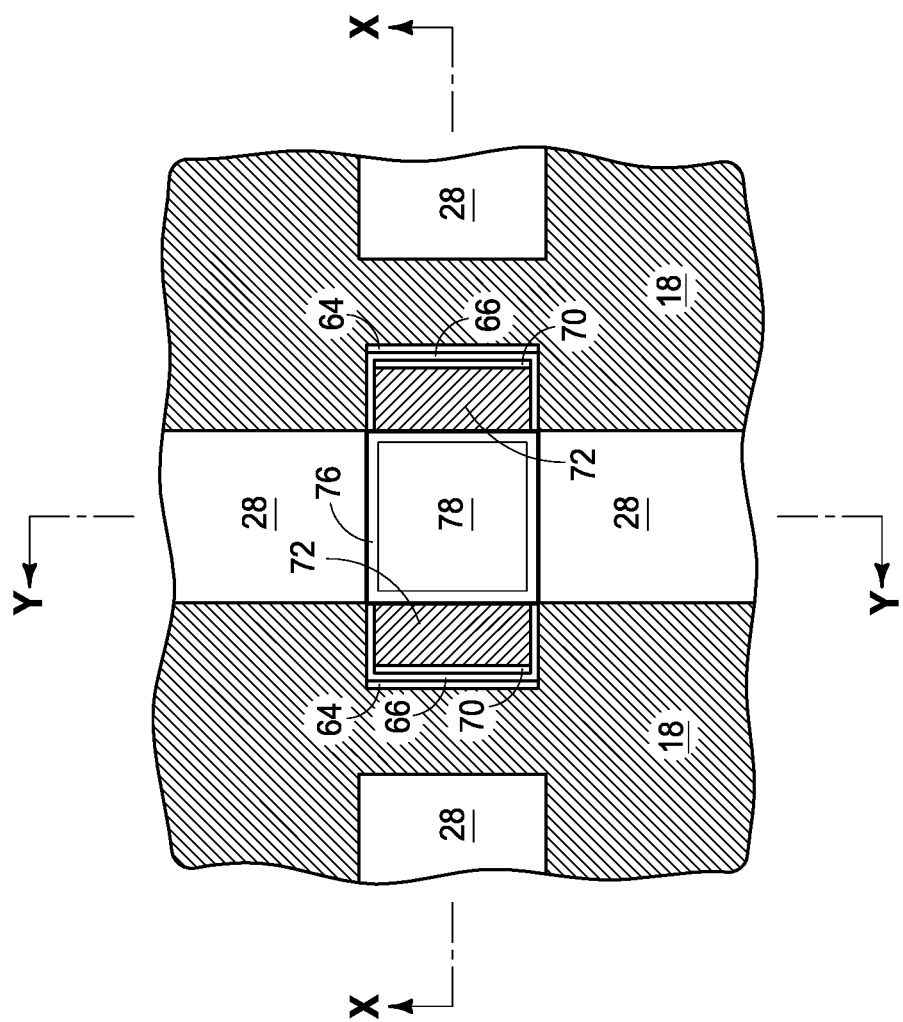
FIG. 32 is a diagrammatic view of a fragment along the lines A-A of FIGS. 30 and 31 illustrating an example embodiment.

FIGS. 30 and 31 show a construction at a processing stage analogous to that of FIGS. 26 and 27, but in which the second charge-blocking material 66 (which may comprise silicon nitride in some embodiments) is formed as a liner entirely along interior regions of cavities 60 (with the cavities 60 being shown in, for example, FIG. 14). FIG. 32 shows a view of a fragment along the lines A-A of FIGS. 30 and 31 in accordance with an example embodiment.

As discussed above with reference to FIG. 26, the memory cells 74 (only some of which are labeled in FIG. 26) may be ultimately incorporated into vertical NAND strings. For instance, in some embodiments one vertical NAND string may be comprised by the region of the stack corresponding to the intervening region 91 (FIG. 26), and another NAND string may be comprised by the region the stack corresponding to intervening region 93 (FIG. 26). The memory cells at each vertical level are connected to circuitry utilized for programming and/or reading the memory cells. For instance, the control gates of the memory cells within intervening region 91 are shown connected to circuitry 100-103, and the control gates of the memory cells within intervening region 93 are shown connected to circuitry 104-107.

The connections of the control gates to the circuitries 100-107 may utilize any suitable landing pad structures, including, for example, so-called "shark-jaw" structures, "staircase" structures, etc. However, it can be difficult provide routing between the control gates and the landing pad structures. A NAND array may have multiple control gates at a common vertical level sharing landing pads and circuitry. For instance, a third intervening region 110 of stack 16 is shown in FIG. 26 to be on an opposing side of an electrically insulative pillar 80 from the stack 93. In some embodiments, the control gates of the memory cells within the third intervening region 110 will be connected to the same circuitry 100-103 as the control gates of the memory cells within the first intervening region 91. Some embodiments utilize an elongated trench to sub-divide the stack 16 and thereby simplify routing to landing pads and/or other circuitry.

Figure 33:
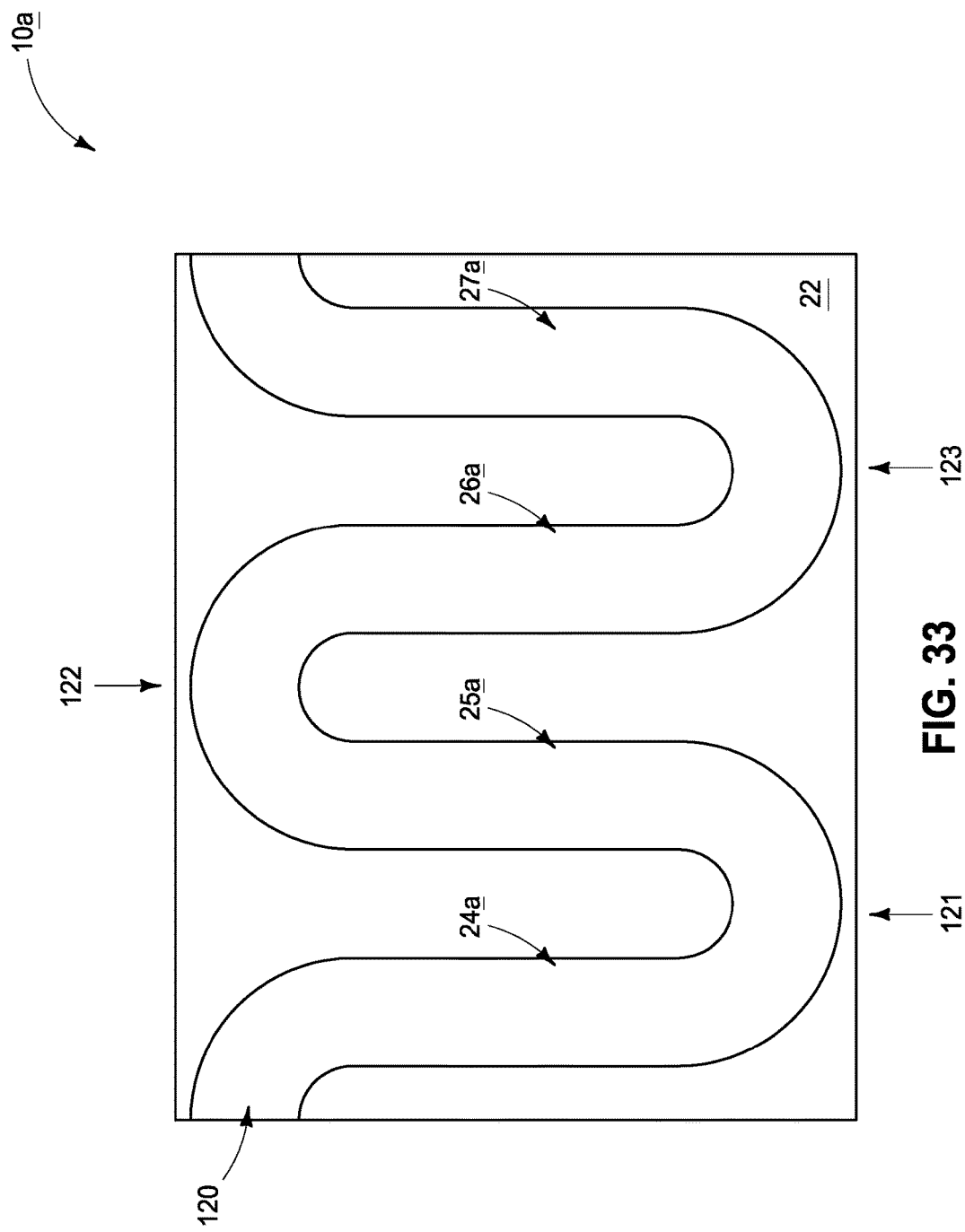
FIGS. 33-36 are top views of a portion of a semiconductor construction at various process stages of another example embodiment method of forming vertical memory strings.

FIG. 33 shows a construction 10a at a processing stage analogous to that of FIG. 4. The construction comprises a single long trench 120 having linear regions 24a-27a in locations analogous to the locations of trenches 24-27 of FIG. 4. The trench 120 serpentines across construction 10a, with the linear regions 24a-27a being joined to one another through curved regions 121-123. In the shown embodiment, the linear regions 24a-27a are substantially parallel to one another.

Figure 34:
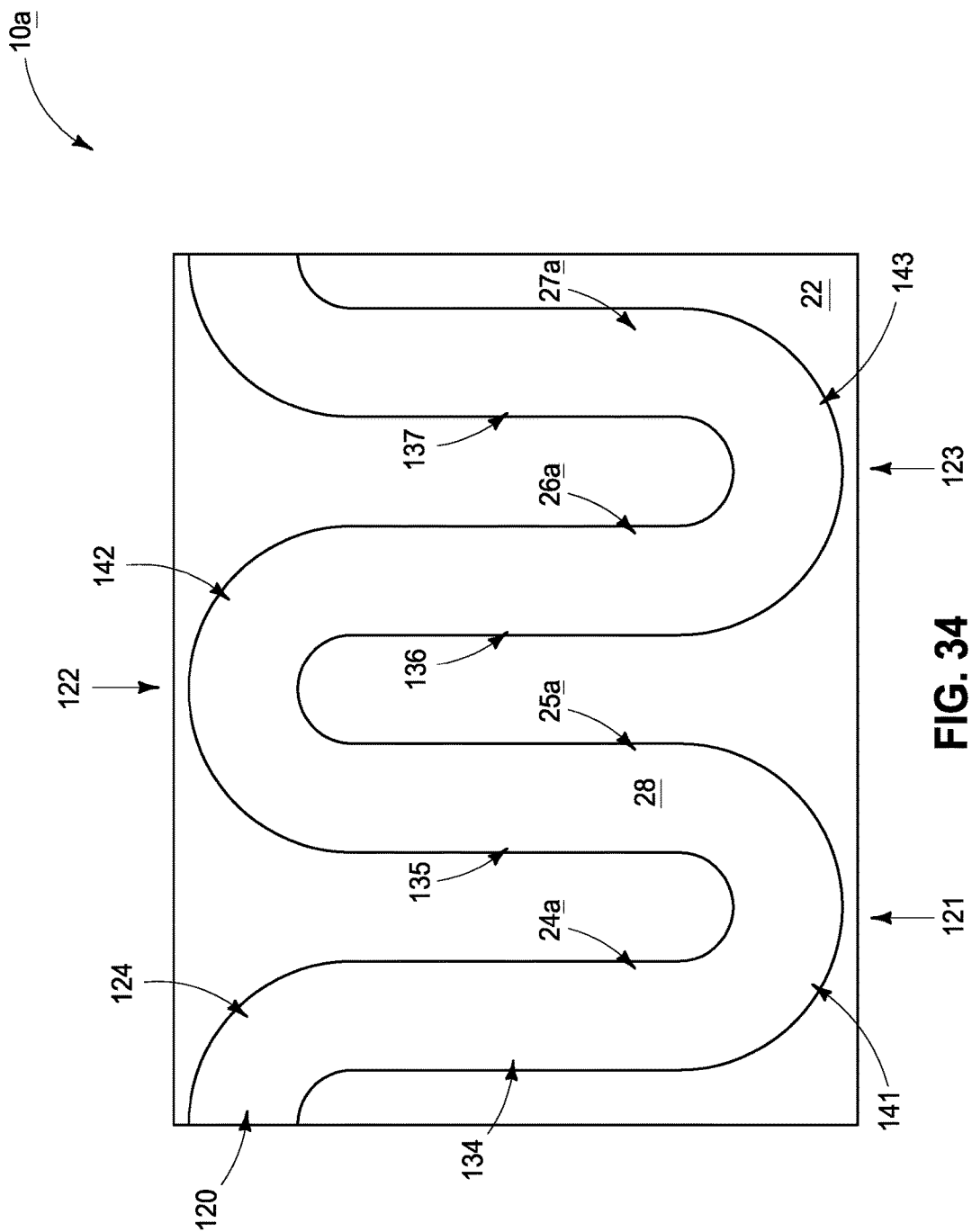

Referring to FIG. 34, the electrically insulative material 28 is formed within trench 120 with processing analogous to that described above with reference to FIG. 7. The electrically insulative material 28 forms a single long panel 124 within the trench 120. Such panel comprises linear regions 134-137 within the linear regions 24a-27a of trench 120. The linear regions 134-137 are joined to one another by curved regions 141-143 of the panel.

Figure 35:
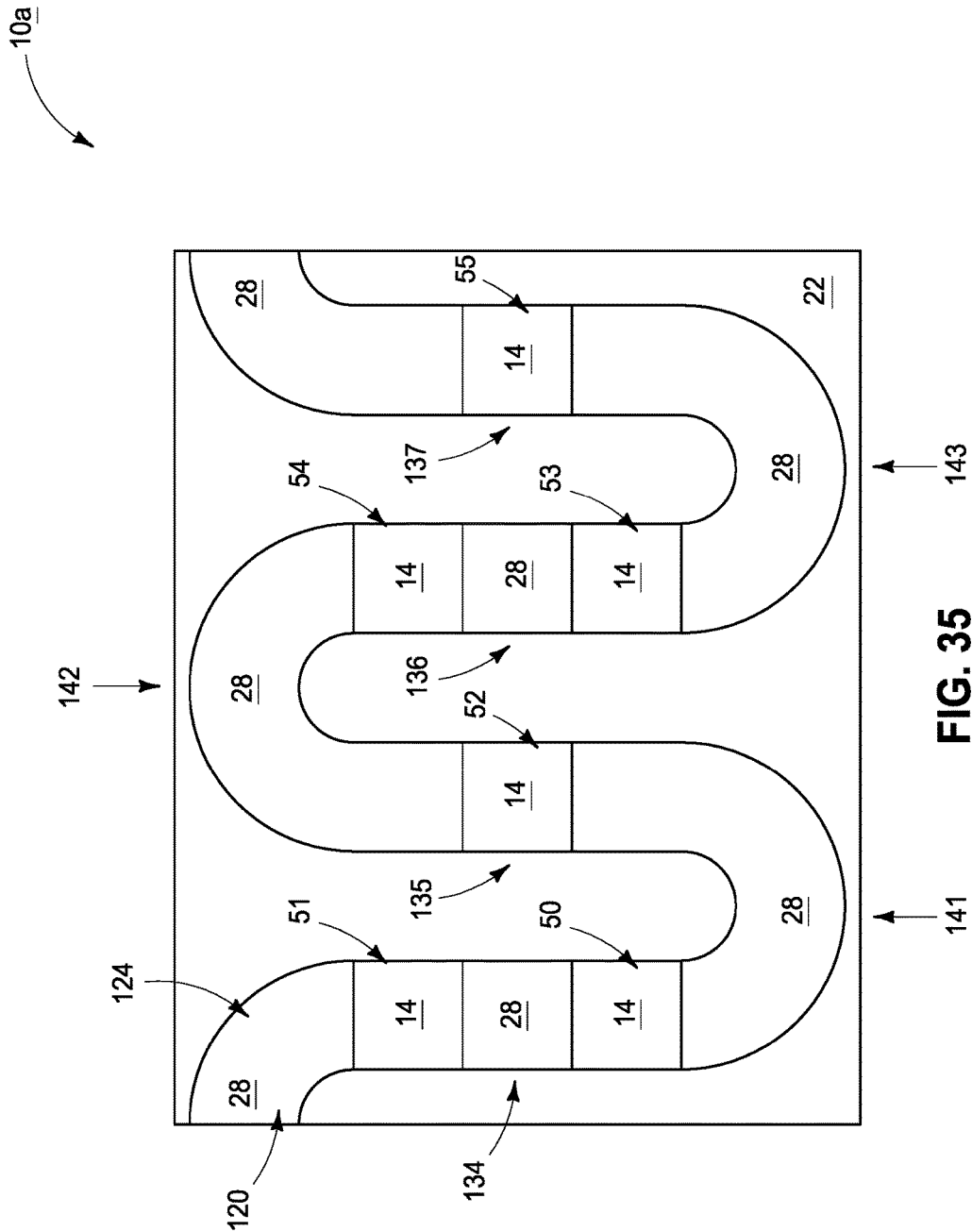

Referring to FIG. 35, the openings 50-55 are formed to extend through the panel 124 with processing analogous to that described above with reference to FIG. 10. In the shown embodiment, the openings are only formed within the linear regions 134-137 of the panel, and not within the curved regions 141-143.

Figure 36:
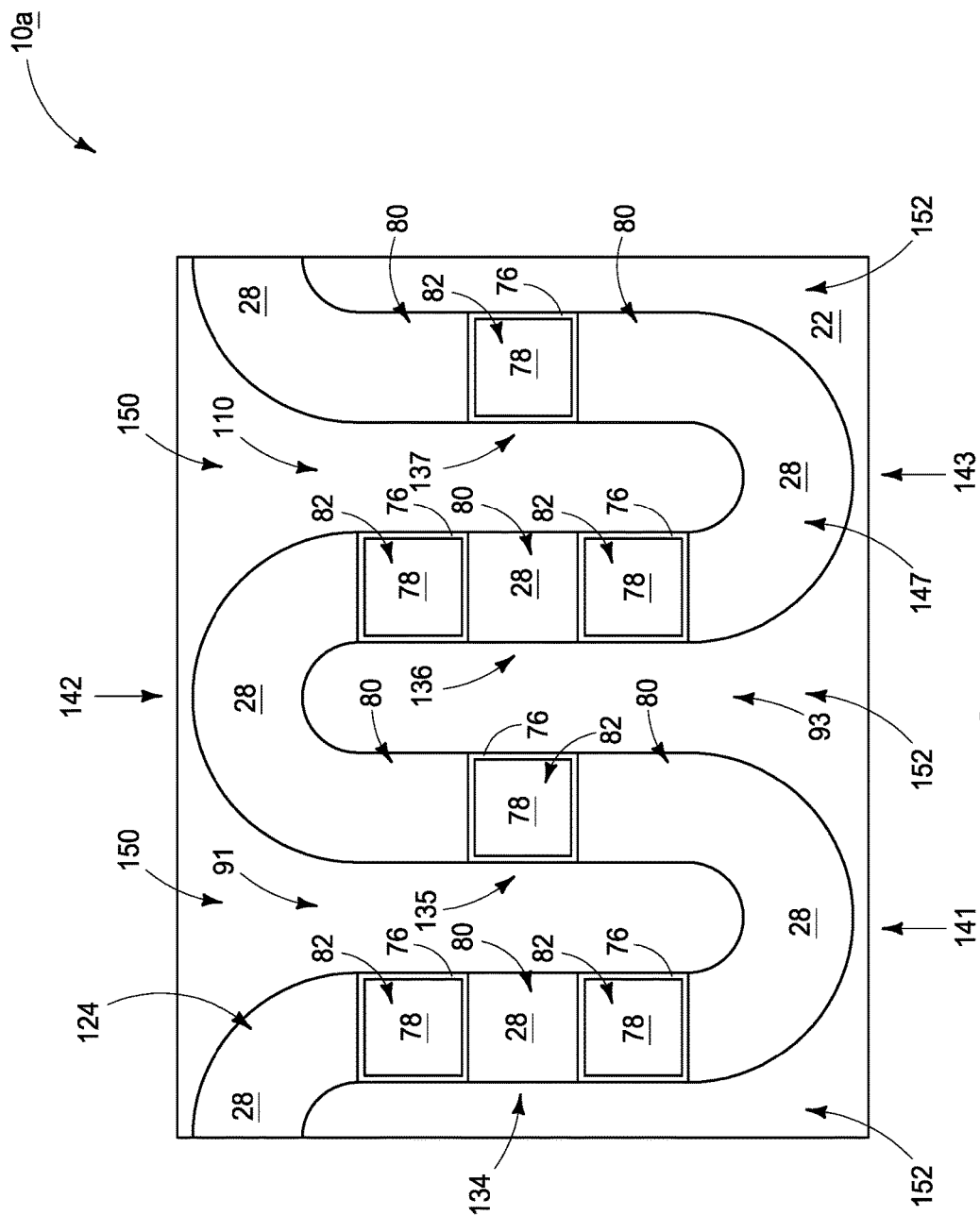

Referring to FIG. 36, the gate dielectric material 76 and channel material 78 are formed within openings 50-55 (FIG. 35), with processing analogous to that described above with reference to FIG. 25. Accordingly, channel material posts 82 and electrically insulative pillars 80 are incorporated into a serpentining structure 147. In the shown embodiment, the channel material posts 82 are only within linear regions 134-137 of such serpentining structure.

An advantage of the embodiment of FIG. 36 is that the serpentining structure 147 can subdivide the NAND strings (for instance, the strings described above with reference to FIG. 26 as being within intervening regions 91, 93 and 110) into two separate groups. A first group is on a side 150 of the serpentining structure, and another group is on an opposing side 152 of the serpentining structure. The control gates on side 150 may be considered to be a first set of control gates, and those on side 152 may be considered to be a second set of control gates. The intervening regions 91, 93 and 110 described above with reference to FIG. 26 are labeled in FIG. 36 to assist in understanding the described embodiment. Intervening regions 91 and 110 are on the same side of the serpentining structure as one another (specifically, the side 150), and the intervening region 93 is on the opposing side of the serpentining structure (specifically, the side 152). Thus, regions 91 and 110 may be considered to comprise control gates within a first set, and region 93 may be considered to comprise control gates within a second set. All of the control gates within the first set that are at a common vertical level may be electrically coupled to one another, and electrically coupled to a common landing pad and/or to other common circuitry (for instance, to the circuitry 100-103 described above with reference to FIG. 26); and all of the control gates within the second set that are at a common vertical level may be electrically coupled to one another, and electrically coupled to a common landing pad and/or to other common circuitry (for instance, to the circuitry 104-107 described above with reference to FIG. 26).

The serpentining structure 147 of FIG. 36 may be one of many substantially identical serpentining structures formed across a semiconductor construction during fabrication of a NAND array.

Although the illustrated serpentining structure 147 has a single electrically insulative material 28 extending between the channel material posts 78 and along the curved regions 141-143, in other embodiments two or more electrically insulative materials may be utilized instead of the single electrically insulative material 28. For instance, a different electrically insulative may be utilized within the curved regions 141-143 than within linear regions between the channel material posts 82.

The NAND configurations and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The terms "posts" and "pillars" are both utilized to describe vertically-extending structures. Both terms are considered synonymous in this disclosure. The utilization of the term "post" in some instances, and the term "pillar" in other instances, is to provide language variation within this disclosure to simplify antecedent basis within the claims that follow, and is not utilized to indicate any significant structural differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming vertically-stacked structures. A stack of alternating electrically conductive levels and electrically insulative levels is formed over a base. An electrically insulative panel is formed which extends through the stack. The panel has a pair of opposing sides along the stack. Some sections of the panel are removed while other sections are left remaining. Openings are formed where sections of the panel are removed. Each opening has a first pair of opposing sides along the stack, and has a second pair of opposing sides along remaining sections of the panel. Cavities are formed which extend into the electrically conductive levels along the first pair of opposing sides of the openings. Dielectric material is formed along exposed edges of the electrically conductive levels within the cavities. Electrically conductive material is formed within the cavities after the dielectric material is formed.

Some embodiments include a method of forming vertical NAND strings. A stack of alternating electrically conductive levels and electrically insulative levels is formed over a base. A trench is formed to extend through the stack. An electrically insulative panel is formed within the trench. The panel has a pair of opposing sides along the stack. Some sections of the panel are removed while other sections are left to remain. Openings are formed where sections of the panel are removed. Each opening has a first pair of opposing sides along the stack, and has a second pair of opposing sides along remaining sections of the panel. Cavities are formed to extend into the electrically conductive levels along the first pair of opposing sides of the openings. Charge blocking material is formed along exposed edges of the electrically conductive levels within the cavities. Charge-storage material is formed within the cavities along the charge blocking material. Gate dielectric material is formed along the charge-storage material. Channel material is formed within the openings and is spaced from the charge-storage material by the gate dielectric material.

Some embodiments include a NAND construction having a stack of alternating electrically conductive levels and electrically insulative levels over a semiconductor base. Electrically insulative pillars extend through the stack. Channel material posts are between the pillars. The channel material posts have a first pair of opposing sides and a second pair of opposing sides. The first pair of opposing sides is spaced from adjacent pillars by intervening regions of the stack. None of the stack is between each of the sides of the second pair of opposing sides and pillars adjacent such sides. Cavities extend into the electrically conductive levels along the first pair of opposing sides of the channel material posts. Charge blocking material is along edges of the electrically conductive levels within the cavities. Charge-storage material is within the cavities and spaced from the electrically conductive levels by the charge blocking material. Gate dielectric material is between the charge-storage material and the channel material posts.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory device, comprising:
   a stack of alternating electrically conductive levels and electrically insulative levels over a material comprising tungsten silicide;
   electrically insulative pillars that extends through the stack and contact
   an upper surface of the material comprising tungsten silicide;
   a channel material post between a first adjacent pair of the pillars, the channel material post extending through the material comprising tungsten silicide and having a first pair of opposing sides and a second pair of opposing sides; each side of the first pair of opposing sides being spaced from a respective one of a second adjacent pair of the pillars by a corresponding intervening region of the stack; none of the stack being present between each side of the second pair of opposing sides and a respective one of the first adjacent pair of the pillars;
   gate dielectric material and charge-storage material between edges of the electrically conductive levels and the channel material post.

2. The memory device of claim 1, further comprising charge blocking material between edges of the electrically conductive levels and the channel material post.

3. The memory device of claim 2, wherein at least some of the electrically conductive levels of the stack comprise control gates.

4. The memory device of claim 3, wherein the charge blocking material is disposed between and contacts the control gates and the charge-storage material.

5. The memory device of claim 4, wherein the charge storage material is in contact with the gate dielectric material.

6. The memory device of claim 5, wherein each of the charge storage material, the charge blocking material and the control gates are in contact with electrically insulative material of the electrically insulative levels.

7. The memory device of claim 5, wherein the charge blocking material comprises a plurality of charge blocking materials.

8. The memory device of claim 7, wherein the plurality of charge blocking materials comprise a first charge blocking material comprising an oxide material, a second charge blocking material comprising a nitride material and a third charge blocking material comprising an oxide material.

9. A memory device, comprising:
   an etchstop material over a semiconductor base;
   a stack of alternating electrically conductive levels comprising control gates and electrically insulative levels over the etchstop material;
   electrically insulative pillars extending through the stack and contacting an upper surface of the etchstop material;
   a channel material post between a first adjacent pair of the pillars; the channel material post extending through the etchstop material and having a first pair of opposing sides and a second pair of opposing sides; each side of the first pair of opposing sides being spaced from a respective one of a second adjacent pair of the pillars by a corresponding intervening region of the stack; none of the stack being present between each side of the second pair of opposing sides and a respective one of the first adjacent pair of the pillars;
   charge-storage material;
   charge blocking material disposed between and contacting the control gates and the charge-storage material; and gate dielectric material between the charge-storage material and the channel material post.

10. The memory device of claim 9, wherein the charge-storage material comprises polycrystalline silicon.

11. The memory device of claim 9, wherein the charge-storage material comprises silicon nitride.

12. The memory device of claim 9, wherein the post and pillars are part of a serpentining structure that extends through the stack.

* * * * *